(12) United States Patent
Godo et al.

(10) Patent No.: US 8,916,866 B2
(45) Date of Patent: Dec. 23, 2014

(54) SEMICONDUCTOR DEVICE

(75) Inventors: Hiromichi Godo, Isehara (JP); Satoshi Kobayashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 67 days.

(21) Appl. No.: 13/279,868

(22) Filed: Oct. 24, 2011

(65) Prior Publication Data

US 2012/0104385 A1    May 3, 2012

(30) Foreign Application Priority Data

Nov. 3, 2010 (JP) .................................. 2010-246951
May 14, 2011 (JP) .................................. 2011-108892

(51) Int. Cl.
*H01L 29/786* (2006.01)
*H01L 21/00* (2006.01)

(52) U.S. Cl.
CPC ...... *H01L 29/7869* (2013.01); *H01L 29/78648* (2013.01)
USPC .......................................... 257/43; 438/149

(58) Field of Classification Search
CPC .... H01L 29/786; H01L 29/4908; H01L 21/00
USPC .......................................... 257/43; 438/149
See application file for complete search history.

(56) References Cited

U.S. PATENT DOCUMENTS

| 5,648,662 | A | 7/1997 | Zhang et al. |
| 5,731,856 | A | 3/1998 | Kim et al. |
| 5,744,864 | A | 4/1998 | Cillessen et al. |
| 6,294,274 | B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Steven J Fulk
*Assistant Examiner* — Damon Hillman
(74) *Attorney, Agent, or Firm* — Eric J. Robinson; Robinson Intellectual Property Law Office, P.C.

(57) ABSTRACT

A semiconductor device includes a first gate electrode; a gate insulating layer covering the first gate electrode; an oxide semiconductor layer that overlaps with the first gate electrode; oxide semiconductor layers having high carrier density covering end portions of the oxide semiconductor layer; a source electrode and a drain electrode in contact with the oxide semiconductor layers having high carrier density; an insulating layer covering the source electrode, the drain electrode, and the oxide semiconductor layer; and a second gate electrode that is in contact with the insulating layer. Each of the oxide semiconductor layers is in contact with part of each of an upper surface, a lower surface, and a side surface of one of the end portions of the oxide semiconductor layer and part of an upper surface of the gate insulating layer.

20 Claims, 21 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,129,719 B2 * | 3/2012 | Yamazaki et al. | 257/43 |
| 8,344,380 B2 | 1/2013 | Godo et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0239335 A1 | 9/2009 | Akimoto et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0181565 A1 * | 7/2010 | Sakata et al. | 257/43 |
| 2011/0121288 A1 * | 5/2011 | Yamazaki et al. | 257/43 |
| 2011/0210325 A1 * | 9/2011 | Sakakura et al. | 257/43 |
| 2012/0129288 A1 * | 5/2012 | Kobayashi et al. | 438/34 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-133819 | 5/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008216529 * | 9/2008 |
| WO | WO-2004/114391 | 12/2004 |
| WO | WO 2010044478 A1 * | 4/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In-Ga-Zn-0 TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, Vol, 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID DIgest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao. T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID DIgest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases fo Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura,K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphousoxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

FIG. 11A    FIG. 11B
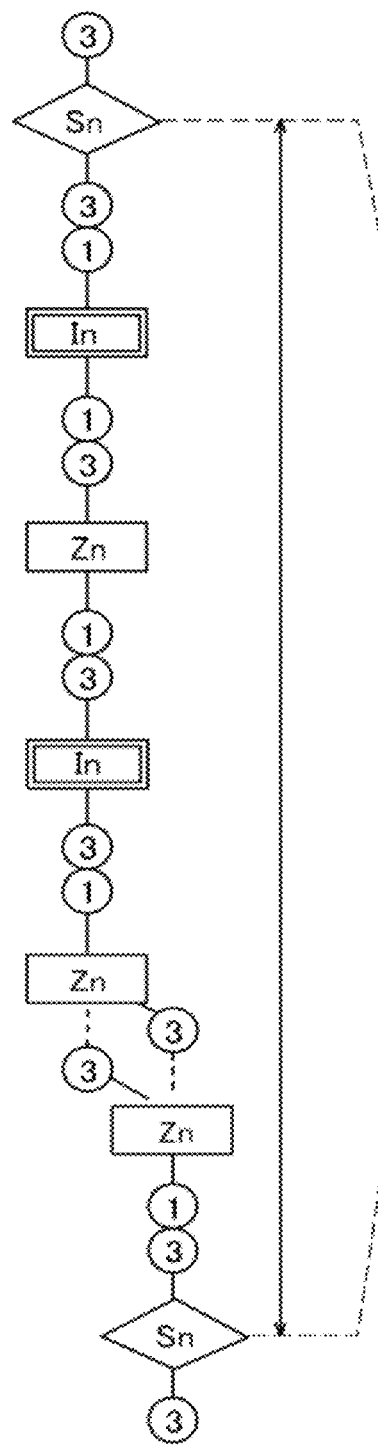
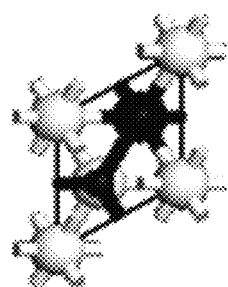
FIG. 11C

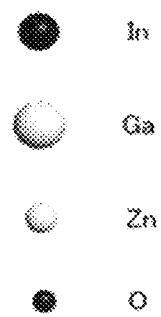

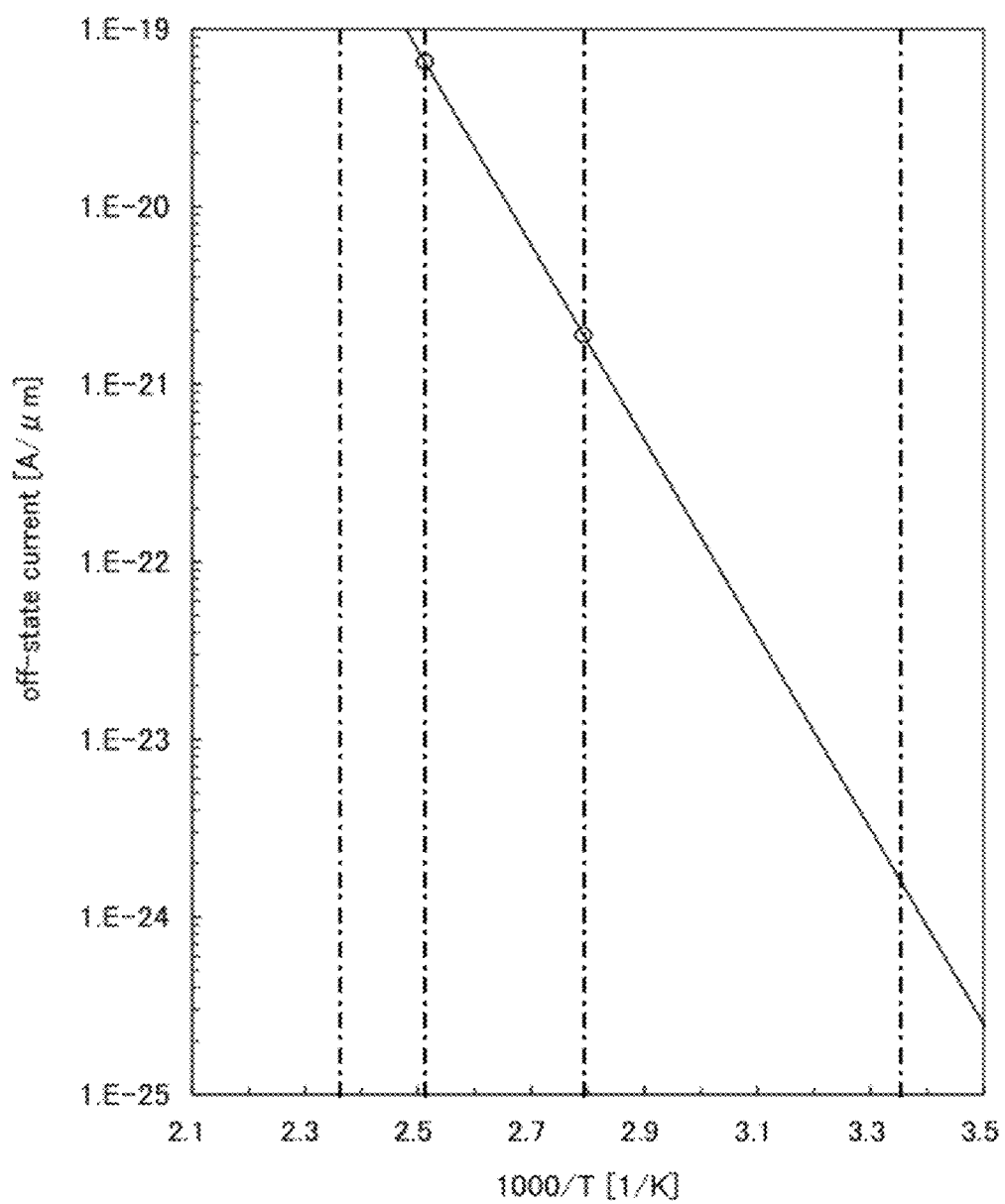

SEMICONDUCTOR DEVICE

BACKGROUND OF THE INVENTION

1. Field of the Invention

Field of the present invention relates to a semiconductor device including an oxide semiconductor.

In this specification, the semiconductor device refers to all the devices that operate by utilizing semiconductor characteristics. A transistor described in this specification is a semiconductor device, and an electrooptic device, a semiconductor circuit, and an electronic device including the transistor are all semiconductor devices.

2. Description of the Related Art

Transistors (thin film transistors and the like) which are used for many liquid crystal display devices and light-emitting display devices typified by flat panel displays have included a silicon semiconductor such as amorphous silicon or polycrystalline silicon and have been formed over glass substrates.

Attention has been directed to a technique by which, instead of such silicon semiconductors, metal oxides exhibiting semiconductor characteristics are used for transistors. Note that in this specification, a metal oxide exhibiting semiconductor characteristics is referred to as an oxide semiconductor.

Examples of the oxide semiconductor include tungsten oxide, tin oxide, indium oxide, zinc oxide, and the like which are single-component metal oxides, and In—Ga—Zn—O-based oxide, which is a homologous compound. Patent Documents 1 and 2 have already disclosed techniques in which such an oxide semiconductor is used to form transistors as switching elements and the like in pixels of a display device.

Semiconductor device using semiconductor characteristics of silicon include power devices for high power application in addition to the above-described liquid crystal display devices and light-emitting display devices. The power device is a semiconductor device which is indispensable to the power control of an electric device, and is used, for example, for a protective circuit of a battery of an electric device, or an inverter for driving an electric motor in a hybrid car.

For a typical power device, there are a rectifier diode, a power metal-oxide silicon field-effect transistor (MOSFET), an insulated gate bipolar transistor (IGBT), and the like; the power device needs favorable breakdown voltage characteristics and high output current.

For example, a technique in which silicon carbide (SiC) that is one of silicon semiconductors is used for a Schottky barrier diode which is superior in breakdown voltage characteristics is known (see Patent Document 3).

REFERENCE

Patent Document 1: Japanese Published Patent Application No. 2007-123861
Patent Document 2: Japanese Published Patent Application No. 2007-096055
Patent Document 3: Japanese Published Patent Application No. 2000-133819

SUMMARY OF THE INVENTION

It is necessary for the power device for high power application to have superior breakdown voltage characteristics and high output current; however, there are many problems in actually manufacturing the power device.

For example, as a method for obtaining superior breakdown voltage characteristics (drain breakdown voltage), the thickness of a semiconductor layer of a power device may be increased; however, output current might be decreased only by the increase in thickness of the semiconductor layer.

In view of the above-described problems, it is an object of one embodiment of the present invention to provide a semiconductor device which has favorable characteristics.

In the case where a semiconductor layer forming a channel region has a large thickness in order to improve breakdown voltage characteristics (drain breakdown voltage) in a field-effect transistor, on-state current is decreased by resistance of the semiconductor layer in the thickness direction of the semiconductor layer.

On-state current refers to current (drain current) which flows between a source electrode and a drain electrode when a field-effect transistor is on. For example, the on-state current refers to current (drain current) which flows between a source electrode and a drain electrode when gate voltage is higher than the threshold voltage of the field-effect transistor.

A field-effect transistor disclosed in the present invention is a dual-gate transistor having two gate electrodes, in which a semiconductor layer having high carrier density is provided in part of a semiconductor layer which forms a channel region. Because of the dual-gate transistor, the channel region can be formed around an interface between the semiconductor layer and an insulating layer which is provided between each of two gate electrodes and the semiconductor layer, so that the on-state current can be improved. In addition, a semiconductor layer having high carrier density is provided in part of the semiconductor layer of the transistor, so that the decrease of the on-state current due to resistance in the thickness direction of the semiconductor layer can be suppressed.

Further, the field-effect transistor disclosed in the present invention has a structure in which an end portion of the semiconductor layer which forms the channel region is covered with a semiconductor layer having high carrier density. With the structure, contact resistance between the semiconductor layer and the source and drain electrodes can be reduced; therefore, the decrease of the on-state current can be suppressed.

In the field-effect transistor disclosed in the present invention, an oxide semiconductor having a band gap larger than that of a silicon semiconductor is used for the semiconductor layer, so that favorable breakdown voltage characteristics (drain breakdown voltage) can be achieved.

One embodiment of the present invention is a semiconductor device including a first gate electrode; a gate insulating layer covering the first gate electrode; an oxide semiconductor layer that overlaps with the first gate electrode and is in contact with the gate insulating layer; oxide semiconductor layers having high carrier density covering end portions of the oxide semiconductor layer; a source electrode and a drain electrode in contact with the oxide semiconductor layers having high carrier density; an insulating layer covering the source electrode, the drain electrode, and the oxide semiconductor layer; and a second gate electrode that is in contact with the insulating layer and is provided between the source electrode and the drain electrode. The oxide semiconductor layers having high carrier density face each other with the oxide semiconductor layer interposed therebetween, and each of the oxide semiconductor layers is in contact with part of each of an upper surface, a lower surface, and a side surface of one of the end portions of the oxide semiconductor layer and part of an upper surface of the gate insulating layer.

Further, the thickness of the oxide semiconductor layer is preferably greater than or equal to 0.2 µm and less than or equal to 10 μm, and the oxide semiconductor layer may be a crystalline oxide semiconductor layer. With the crystalline oxide semiconductor layer, it is possible to provide a highly reliable semiconductor device in which changes of the electrical characteristics of the transistor due to irradiation with visible light or ultraviolet light can be suppressed. The crystalline oxide semiconductor layer includes an oxide including a crystal with c-axis alignment (also referred to as C-Axis Aligned Crystal (CAAC)), which has neither a single crystal structure nor an amorphous structure.

In other words, another embodiment of the present invention is the above-described semiconductor device in which the oxide semiconductor layer is a crystalline oxide semiconductor layer, and the crystalline oxide semiconductor layer has an a-b plane parallel to a surface of the crystalline oxide semiconductor layer and has c-axis alignment in a direction perpendicular to the surface.

Further, another embodiment of the present invention is a semiconductor device including the crystalline oxide semiconductor layer containing zinc. In addition, another embodiment of the present invention is a semiconductor device including the crystalline oxide semiconductor layer containing zinc and indium.

According to one embodiment of the present invention, the decrease of the on-state current can be suppressed, and a semiconductor device having high breakdown voltage characteristics (drain breakdown voltage) can be provided.

BRIEF DESCRIPTION OF THE DRAWINGS

FIGS. 11A to 11C are examples of an oxide semiconductor.

FIG. 20 illustrates temperature dependence of off-state current of a transistor.

DETAILED DESCRIPTION OF THE INVENTION

Figure 1A:
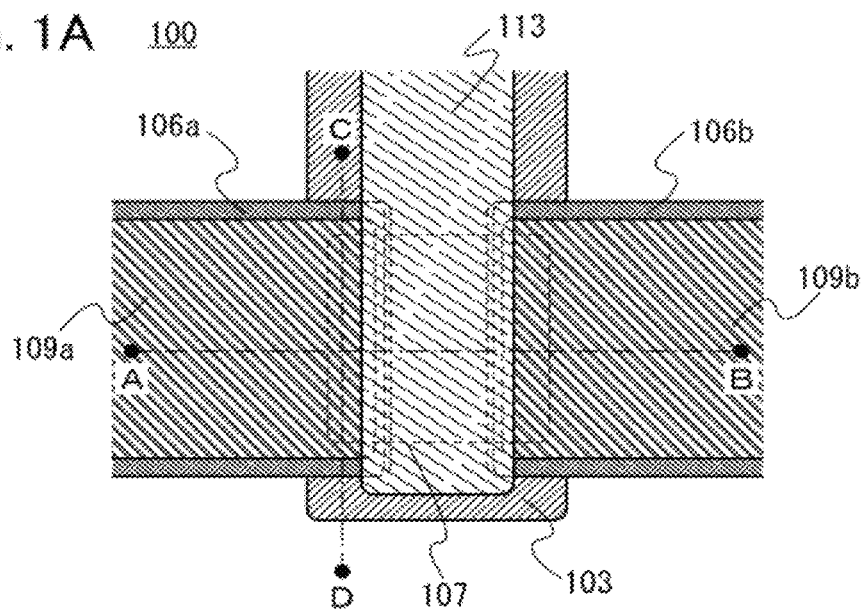
FIGS. 1A to 1C are a plan view and cross-sectional views illustrating a transistor which is one embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the spirit and scope of the present invention. Accordingly, the present invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. Note that the size, the layer thickness, or the region of each structure illustrated in each drawing is exaggerated for clarity in some cases. Therefore, the present invention is not necessarily limited to such scales illustrated in the drawings.

In an illustration of a stack of layers (or electrodes) included in a transistor, an end portion of a lower layer which protrudes from an end portion of an upper layer is not illustrated in some cases for convenience in a plan view of the transistor.

Note that when it is described that "A and B are connected to each other", the case where A and B are electrically connected to each other, and the case where A and B are directly connected to each other are included therein. Here, each of A and B corresponds to an object (e.g., a device, an element, a circuit, a wiring, an electrode, a terminal, a conductive film, or a layer).

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that, functions of "source" and "drain" may become switched in the case where a direction of a current flow is changed during circuit operation, for example. Therefore, the terms "source" and "drain" can be used to denote the drain and the source, respectively, in this specification.

Embodiment 1

In this embodiment, a structure of a transistor and a method for manufacturing the transistor according to one embodiment of the present invention will be described with reference to FIGS. 1A to 1C, FIGS. 2A to 2D, and FIGS. 3A to 3D.

<Structure of Transistor 100>

FIG. 1A is a plan view of a transistor 100. Note that a base insulating layer 102, a gate insulating layer 105, and an insulating layer 111 are not illustrated in FIG. 1A for convenience. FIG. 1A illustrates a first gate electrode 103 functioning as a gate electrode, an oxide semiconductor layer 107 functioning as a channel formation region, oxide semiconductor layers 106a and 106b having high carrier density, a source electrode 109a, a drain electrode 109b, and a second gate electrode 113 which is provided between the source electrode 109a and the drain electrode 109b, which overlaps with the oxide semiconductor layer 107 with the insulating layer 111 interposed therebetween, and which functions as a back gate electrode. In other words, the transistor 100 is a dual-gate transistor.

Figure 1B:
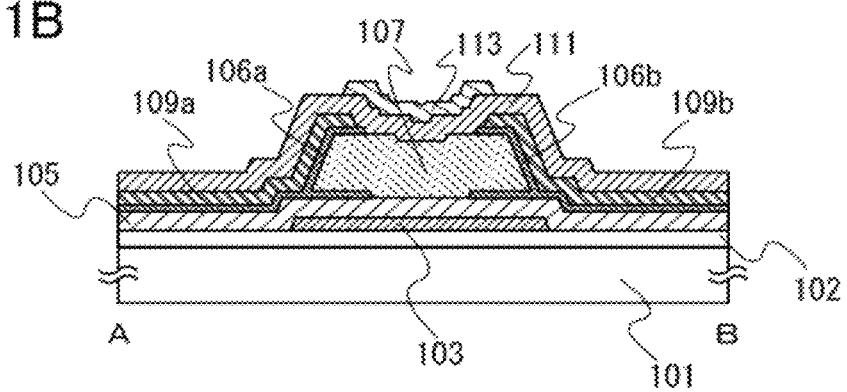

Next, a cross-sectional view of the transistor 100 taken along line A-B is illustrated in FIG. 1B. The transistor 100 includes, over a substrate 101, the base insulating layer 102, the first gate electrode 103, the gate insulating layer 105, the oxide semiconductor layer 107, the oxide semiconductor layers 106a and 106b having high carrier density, the source electrode 109a, the drain electrode 109b, the insulating layer 111, and the second gate electrode 113.

The cross-sectional structure of the transistor 100 taken along line A-B is described. The base insulating layer 102 is provided over the substrate 101. The first gate electrode 103 is provided in contact with the base insulating layer 102. The first gate electrode 103 is covered with the gate insulating layer 105. The oxide semiconductor layer 107 overlaps with the first gate electrode 103 and is provided in contact with the gate insulating layer 105. End portions of the oxide semiconductor layer 107 are covered with the oxide semiconductor layers 106a and 106b having high carrier density. The source electrode 109a and the drain electrode 109b are in contact with the oxide semiconductor layers 106a and 106b having high carrier density. The insulating layer 111 covers the oxide semiconductor layer 107, the source electrode 109a, and the drain electrode 109b. The second gate electrode 113 is in contact with the insulating layer 111 and is between the source electrode 109a and the drain electrode 109b.

In addition, the oxide semiconductor layers 106a and 106b having high carrier density face each other with the oxide semiconductor layer 107 interposed therebetween and each of the oxide semiconductor layers is in contact with part of each of an upper surface, a lower surface, and a side surface of one of the end portions of the oxide semiconductor layer 107 and part of an upper surface of the gate insulating layer 105.

Figure 1C:
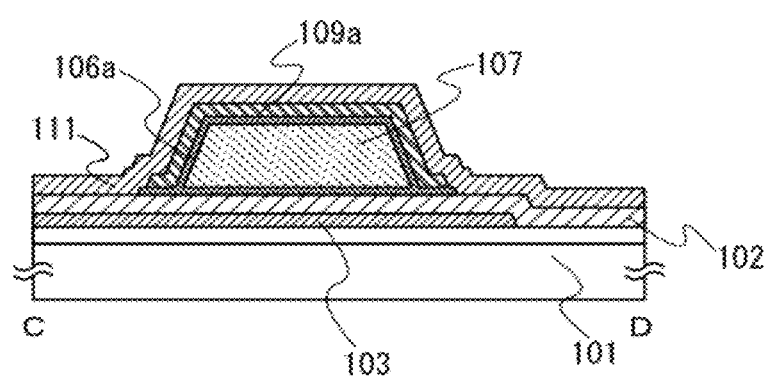

Further, a cross-sectional view taken along line C-D of FIG. 1A is illustrated in FIG. 1C. FIG. 1C illustrates the source electrode 109a. The oxide semiconductor layer 106a having high carrier density is in contact with all of the upper surface, the lower surface, and the side surfaces of the oxide semiconductor layer 107. The source electrode 109a is in contact with the oxide semiconductor layer 106a having high carrier density.

In the transistor 100, since the oxide semiconductor layers 106a and 106b having high carrier density cover the end portions of the oxide semiconductor layer 107 and are in contact with the source electrode 109a and the drain electrode 109b, the contact resistance between the oxide semiconductor layer 107 and the source electrode 109a and the drain electrode 109b can be reduced, so that the decrease of the on-state current which is generated by the contact resistance can be suppressed.

When a semiconductor layer which is a channel formation region has a large thickness in order to improve the breakdown voltage characteristics (drain breakdown voltage) in a field-effect transistor, on-state current is decreased by resistance in a thickness direction of the semiconductor layer. However, like in FIG. 1B and FIG. 1C, when parts of the oxide semiconductor layers 106a and 106b having high carrier density are formed between the gate insulating layer 105 and the oxide semiconductor layer 107, the decrease of the on-state current due to the resistance in the thickness direction of the semiconductor layer can be suppressed.

It is expected that the effect which suppresses the decrease of the off-state current can be obtained also when parts of the oxide semiconductor layers 106a and 106b having high carrier density formed between the gate insulating layer 105 and the oxide semiconductor layer 107 are replaced with any of metal materials, an alloy material thereof, and the like. However, in that case, contact resistance does not produce such an effect sufficiently because any of the metal materials or the alloy material thereof is in contact with the oxide semiconductor layer 107. Therefore, it is preferable that the oxide semiconductor layers 106a and 106b having high carrier density be formed in parts of the portion between the gate insulating layer 105 and the oxide semiconductor layer 107.

Since the transistor 100 is a dual-gate transistor having the first gate electrode 103 and the second gate electrode 113, a channel region can be formed around the interface between the oxide semiconductor layer 107 and the gate insulating layer 105 and around the interface between the oxide semiconductor layer 107 and the insulating layer 111; therefore, the on-state current of the transistor 100 can be improved.

<Component of Transistor 100>

As the substrate 101, an alkali-free glass substrate formed by a fusion method or a float method, a plastic substrate having heat resistance sufficient to withstand heat treatment to be performed later, or the like can be used. In addition, a substrate where an insulating film is provided on a surface of a metal substrate such as a stainless steel substrate, or a substrate where an insulating film is provided on a surface of a semiconductor substrate may be used.

As a glass substrate, if the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than diboron trioxide ($B_2O_3$). Therefore, a glass substrate containing a larger amount of BaO than boric acid is preferably used.

Note that, instead of the glass substrate described above, a substrate formed using an insulator, such as a ceramic substrate, a quartz substrate, or a sapphire substrate, may be used. Alternatively, crystallized glass or the like may be used.

The base insulating layer 102 provided between the substrate 101 and the first gate electrode 103 can prevent not only diffusion of an impurity element from the substrate 101 but also etching of the substrate 101 during an etching step included in the steps for manufacturing the transistor. Therefore, the thickness of the base insulating layer 102 is preferably, but not limited to, 50 nm or more. Note that the base insulating layer 102 is formed with a single-layer structure or a layered structure using an oxide insulating film and/or a nitride insulating film such as a silicon oxide film, a gallium oxide film, an aluminum oxide film, a silicon nitride film, a silicon oxynitride film, an aluminum oxynitride film, and a silicon nitride oxide film. An aluminum nitride film, an aluminum nitride oxide film, and a silicon nitride film which have a high thermal conductivity are particularly effective in improving thermal dissipation when used for the base insulating film. Since an alkali metal such as Li or Na is an impurity, it is preferable to reduce the content of such an alkali metal. In the case where a glass substrate including an impurity such as an alkali metal is used as the substrate 101, the base insulating layer 102 is preferably formed using a nitride insulating film such as a silicon nitride film or an aluminum nitride film in order to prevent the entry of the alkali metal, and in that case, an oxide insulating film is preferably formed over the nitride insulating film.

The first gate electrode 103 serving as a gate electrode can be formed using a metal material such as molybdenum, titanium, tantalum, tungsten, aluminum, copper, chromium, neodymium, or scandium or an alloy material which includes any of these materials as its main component. In addition, the first gate electrode 103 can have a single-layer structure or a layered structure having two or more layers. For example, a single-layer structure of an aluminum film containing silicon, a two-layer structure of an aluminum film and a titanium film stacked thereover, a two-layer structure of a tungsten film and a titanium film stacked thereover, a three-layer structure in which a titanium film, an aluminum film, and a titanium film are stacked in that order, and the like can be given.

The thickness of the first gate electrode 103 is not particularly limited and can be determined as appropriate in consideration of electrical resistance of a conductive film formed with a metal material, an alloy material, or another compound and the time the formation step takes.

The gate insulating layer 105 is in contact with the oxide semiconductor layer 107 and thus needs to have high quality. This is because the oxide semiconductor layer 107 which is an i-type or a substantially i-type oxide semiconductor layer obtained by removal of impurities (an oxide semiconductor layer whose hydrogen concentration is reduced and which is highly purified) is extremely sensitive to an interface state and interface electric charge, and thus an interface between the oxide semiconductor layer 107 the gate insulating layer 105 is important.

The gate insulating layer 105 can be formed using a silicon oxide film, a gallium oxide film, an aluminum oxide film, a silicon nitride film, a silicon oxynitride film, an aluminum oxynitride film, or a silicon nitride oxide film. Note that the gate insulating layer 105 preferably includes oxygen in a portion which is in contact with the oxide semiconductor layer 107. In particular, the oxide insulating film preferably contains a large amount of oxygen which exceeds at least the stoichiometry in (a bulk of) the film. For example, in the case where a silicon oxide film is used as the gate insulating layer 105, the composition formula is $SiO_{2+\alpha}$ (note that $\alpha>0$). By using the silicon oxide film as the gate insulating layer 105, oxygen can be supplied to the oxide semiconductor layer 107 and favorable characteristics can be obtained. Further, the gate insulating layer 105 is preferably formed in consideration of the size of a transistor to be formed (channel length and channel width) and the step coverage with the gate insulating layer 105.

When the gate insulating layer 105 is formed using, for example, a high-k material such as hafnium oxide, yttrium oxide, hafnium silicate ($HfSi_xO_y$, ($x>0$, $y>0$)), hafnium silicate to which nitrogen is added ($HfSi_xO_yN_z$ ($x>0$, $y>0$, $z>0$)), or hafnium aluminate ($HfAl_xO_y$ ($x>0$, $y>0$)), gate leakage current can be reduced. The gate insulating layer 105 may be formed with either a single-layer structure or a layered structure. When the thickness of the gate insulating layer 105 is increased, gate leakage current can be reduced. Note that the thickness of the gate insulating layer may be greater than or equal to 50 nm and less than or equal to 500 nm.

The oxide semiconductor layer 107 can be formed using a four-component metal oxide such as an In—Sn—Ga—Zn-based metal oxide, a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, a two-component metal oxide such as an In—Ga-based metal oxide, an In—Zn-based metal oxide, a Sn—Zn-based metal oxide, or an Al—Zn-based metal oxide, a single-component metal oxide such as zinc oxide, or the like. In addition to the above-described metal oxides, there are metal oxides such as indium oxide and tin oxide, and one of these metal oxides can be used for the oxide semiconductor layer 107. The oxide semiconductor layer 107 is preferably formed using a metal oxide containing zinc or a metal oxide containing zinc and indium, considering the manufacture of a crystalline oxide semiconductor described later. For example, an In—Ga—Zn-based material means an oxide film containing indium (In), gallium (Ga), and zinc (Zn), and there is no particular limitation on the composition ratio. Further, the In—Ga—Zn-based metal oxide may contain an element other than In, Ga, and Zn.

Further, it is preferable that the oxide semiconductor layer 107 be highly purified by sufficient removal of impurities such as hydrogen and sufficient supply of oxygen. Specifically, the concentration of hydrogen in the oxide semiconductor layer 107 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the concentration of hydrogen in the oxide semiconductor layer 107 is measured by secondary ion mass spectroscopy (SIMS). The density of carriers generated due to a donor such as hydrogen in the oxide semiconductor layer 107, in which hydrogen is reduced to a sufficiently low concentration and in which defect states in an energy gap due to oxygen deficiency are reduced by sufficiently supplying oxygen as described above in a manufacturing process to be described later, is greater than or equal to $1\times10^{10}$/cm$^3$ and less than or equal to $1\times10^{13}$/cm$^3$. In this manner, by using an i-type (intrinsic) or substantially i-type oxide semiconductor, the transistor 100 which has favorable electrical characteristics can be obtained. Since an alkali metal such as Li or Na is an impurity, the content of such an alkali metal is preferably reduced. The concentration of the alkali metal in the oxide semiconductor layer 107 is $2\times10^{16}$ cm$^{-3}$ or lower, preferably $1\times10^{15}$ cm$^{-3}$ or lower. Further the content of an alkaline earth metal is preferably low because the alkaline earth metal is also an impurity.

In particular, an In—Ga—Zn—O-based metal oxide is preferably employed as a semiconductor material used for a semiconductor device because it has sufficiently high resistance when no electric field is applied and because it has high field-effect mobility.

The drain breakdown voltage of a field-effect transistor depends on the thickness of the oxide semiconductor layer. Therefore, in order to increase the drain breakdown voltage, the thickness of the oxide semiconductor layer 107 is preferably large and can be selected in accordance with the desired drain breakdown voltage. Therefore, considering the amount of current between the source electrode and the drain electrode and the drain breakdown voltage, the thickness of the oxide semiconductor layer 107 is preferably in the range of 0.2 μm to 10 μm.

The drain breakdown voltage of a transistor including an oxide semiconductor will now be described.

When the electric field in the semiconductor reaches a certain threshold value, impact ionization occurs, carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have kinetic energy that is larger than or equal to the band gap of the semiconductor. It is known that the impact ionization coefficient that shows probability of impact ionization has correlation with the band gap and that the impact ionization is unlikely to occur as the band gap is increased.

Since the band gap of the oxide semiconductor is 3.15 eV, which is larger than the band gap of silicon, 1.12 eV, the avalanche breakdown is expected to be unlikely to occur. Therefore, a transistor including an oxide semiconductor has high drain breakdown voltage, so that on-state current does not easily increase sharply in an exponential manner even when a high electric field is applied.

Next, hot-carrier degradation of a transistor including an oxide semiconductor will be described.

The hot-carrier degradation means deterioration of transistor characteristics, e.g., shift in the threshold voltage or gate leakage current, which is caused as follows: electrons that are accelerated to be rapid are injected in the vicinity of a drain in a channel into a gate insulating film and become fixed electric charge or form trap levels at the interface between the gate insulating film and the oxide semiconductor. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and electrons that are accelerated to be so rapid as to go over a barrier to the gate insulating film are increased in number. However, the oxide semiconductor has a wide band gap; therefore, the avalanche breakdown is unlikely to occur and resistance to the hot-carrier degradation is higher than that of silicon. For this reason, it can be said that a transistor including the oxide semiconductor has a high drain breakdown voltage. Therefore, the transistor described in this embodiment is suitable for a power device for high power application such as a rectifier diode or an insulated gate bipolar transistor (IGBT).

The oxide semiconductor layers 106a and 106b having high carrier density, which cover the end portions of the oxide semiconductor layer 107 can be formed using an In—Zn—O-based material, an In—Sn—O-based material, an In—O-based material, or a Sn—O-based material. The above-mentioned material may contain $SiO_x$ (x>0, e.g., $SiO_2$); when the above-mentioned material contains $SiO_x$, it becomes easy to make the oxide semiconductor layers 106a and 106b having high carrier density amorphous. In that case, when heat treatment is performed in the steps for manufacturing the transistor 100, the oxide semiconductor layers 106a and 106b having high carrier density can be prevented from being crystallized. The oxide semiconductor layers 106a and 106b having high carrier density may have a thickness of greater than or equal to 1 nm and less than or equal to 200 nm.

The source electrode 109a and the drain electrode 109b can be formed using any of the metal materials and the alloy materials given in the description of the first gate electrode 103, and the thickness and structure of the electrodes can be determined as appropriate based on the description of the first gate electrode 103.

The insulating layer 111 can be formed using any of the insulating films given in the description of the gate insulating layer 105. The insulating layer 111 is also in contact with the oxide semiconductor layer 107 which is a channel formation region; therefore, a portion of the insulating layer 111 which is in contact with the oxide semiconductor layer 107 preferably contains oxygen, and in particular, the insulating layer 111 is preferably formed using a silicon oxide film. By using the silicon oxide film ($SiO_{2+\alpha}$ (note that $\alpha$>0)), oxygen can be supplied to the oxide semiconductor layer 107 and favorable characteristics can be obtained. Alternatively, the high-k material given in the description of the gate insulating layer 105 can also be used. Further the insulating layer 111 may be formed with either a single-layer structure or a layered structure. When the thickness of the insulating layer 111 is increased, gate leakage current on the back gate side can be reduced. The thickness of the insulating layer 111 is preferably greater than or equal to 50 nm and less than or equal to 500 nm.

The second gate electrode 113 serving as a back gate electrode can be formed using any of the metal materials and the alloy materials given in the description of the first gate electrode 103, and the thickness and structure of the electrode can be determined as appropriate based on the description of the first gate electrode 103.

In view of reliability, the electrical characteristics of the transistor including an oxide semiconductor are changed by irradiation with visible light or ultraviolet light or application of heat or an electric field. As an example of a change of the electrical characteristics, the transistor becomes a normally-on transistor in which the drain current flows even in the state where no voltage is applied to the gate electrode ($V_g$=0). In the case where the transistor 100 according to one embodiment of the present invention is considered as an n-channel transistor in which an electron is a majority carrier, an electron in the drain current flows in a region where a depletion layer is formed. In other words, the region where an electron flows includes the oxide semiconductor layer 107 on the side where the source electrode 109a, the drain electrode 109b, and the insulating layer 111 are provided (the upper side of the oxide semiconductor layer 107 in FIG. 1B). Therefore, a hole is induced by the electrons and led to the insulating layer 111 on the oxide semiconductor layer 107 side (the bottom side of the insulating layer 111 in FIG. 1B); accordingly, it can be said that the transistor becomes normally-on as time passes. Thus, since the transistor 100 has the second gate electrode 113, a given potential can be applied to the second gate electrode 113, and the threshold voltage (Vth) is controlled, so that the transistor can be prevented from becoming normally-on.

Here, the shape of the second gate electrode 113 is described with reference to FIGS. 2A to 2D.

Figure 2A:
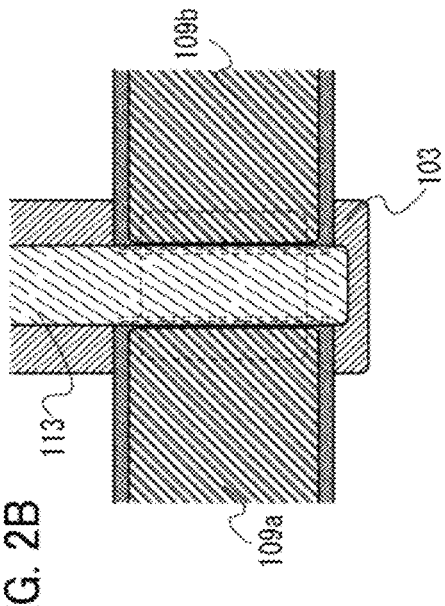
FIGS. 2A to 2D are plan views each illustrating a transistor which is one embodiment of the present invention.

The second gate electrode 113 illustrated in FIG. 2A has the same shape as the second gate electrode 113 illustrated in FIG. 1A. The second gate electrode 113 can be formed to be parallel to the first gate electrode 103 and overlaps with the source electrode 109a and the drain electrode 109b with the insulating layer 111 interposed therebetween. In that case, a potential applied to the second gate electrode 113 and a potential applied to the first gate electrode 103 can be controlled independently. Therefore, the above advantageous effect can be obtained.

Figure 2B:
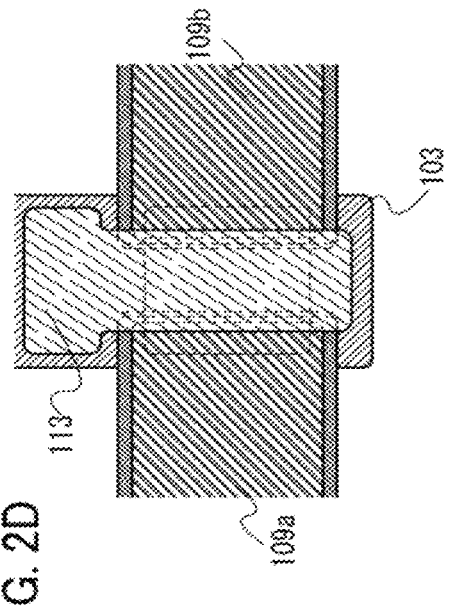

As illustrated in FIG. 2B, it is possible that the second gate electrode 113 is parallel to the first gate electrode 103 but does not overlap with the source electrode 109a and the drain electrode 109b. Also in this configuration, since a potential applied to the second gate electrode 113 and a potential applied to the first gate electrode 103 can be controlled independently, the threshold voltage (Vth) can be controlled, so that the transistor can be prevented from becoming normally-on.

Figure 2C:
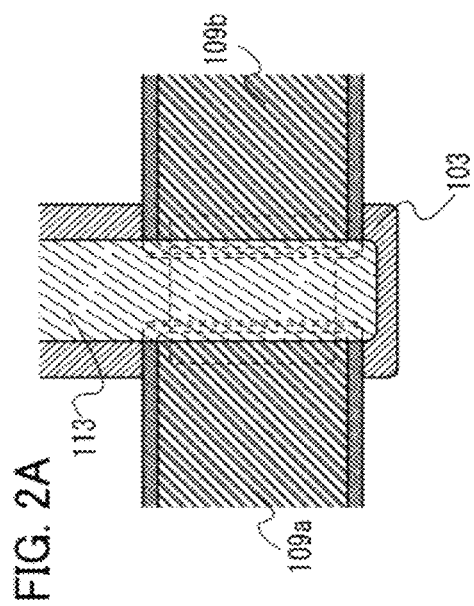

As illustrated in FIG. 2C, the second gate electrode 113 can be connected to the first gate electrode 103. In other words, the first gate electrode 103 and the second gate electrode 113 can be electrically connected to each other through an opening 150 formed in the gate insulating layer 105 and the insulating layer 111. In that case, the potential applied to the second gate electrode 113 and the potential applied to the first gate electrode 103 are equal. Therefore, the transistor can be prevented from becoming normally-on.

Figure 2D:
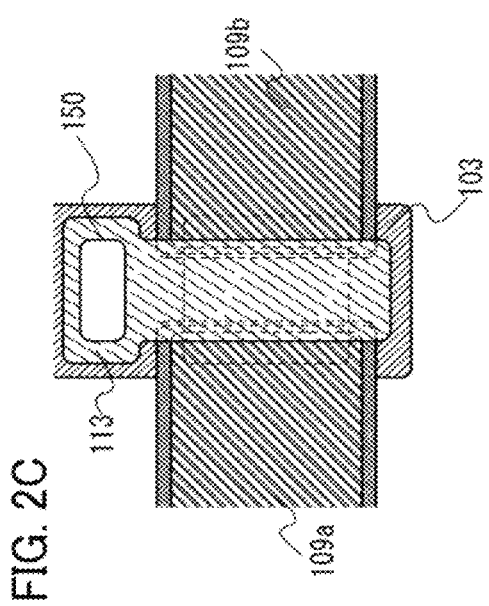

As illustrated in FIG. 2D, the second gate electrode 113 is not necessarily connected to the first gate electrode 103 and may be in a floating state.

Further, like the structure in FIG. 2B, it is possible that the second gate electrode 113 does not overlap with the source electrode 109a and the drain electrode 109b with the insulating layer 111 interposed therebetween in the structures illustrated in FIG. 2C and FIG. 2D.

Although not illustrated in FIGS. 1A to 1C, a protective insulating layer may be provided over the insulating layer 111 or the second gate electrode 113 in the transistor 100.

<Manufacture Method of Transistor 100>

Next, a method for manufacturing the transistor 100 is described with reference to FIGS. 3A to 3D.

The base insulating layer 102 is formed over the substrate 101. Through this process, an effect such that impurities in a glass substrate can be prevented from entering the transistors to be formed can be obtained.

The base insulating layer 102 can be formed by a sputtering method, a CVD method, a coating method, or the like.

Note that when the base insulating layer 102 is formed by a sputtering method, the base insulating layer 102 is preferably formed while hydrogen, water, a hydroxyl group, hydride, or the like remaining in a treatment chamber is removed. This is for preventing hydrogen, water, a hydroxyl group, hydride, or the like from being contained in the base insulating layer 102. An entrapment vacuum pump is preferably used in order to remove hydrogen, water, a hydroxyl group, hydride, or the like remaining in the treatment chamber. As an entrapment vacuum pump, for example, a cryopump, an ion pump, or a titanium sublimation pump is preferably used. The evacuation unit may be a turbo pump provided with a cold trap. Hydrogen, water, a hydroxyl group, hydride, or the like is removed from the treatment chamber which is evacuated with a cryopump; thus, when the base insulating layer 102 is formed in the treatment chamber, the concentration of impurities contained in the base insulating layer 102 can be reduced.

It is preferable to use a high-purity gas from which an impurity such as hydrogen, water, a hydroxyl group, or hydride is removed to the degree that the impurity concentration is expressed in ppm or ppb, as a sputtering gas used when the base insulating layer 102 is formed.

In this embodiment, the substrate 101 is transferred to the treatment chamber, a sputtering gas containing high-purity oxygen, from which hydrogen, water, a hydroxyl group, hydride, or the like is removed, is introduced into the treatment chamber, and a silicon oxide film is formed as the base insulating layer 102 over the substrate 101 using a silicon target. Note that when the base insulating layer 102 is formed, the substrate 101 may be heated.

When the base insulating layer 102 is formed using a layered structure, for example, a silicon nitride film is formed using a silicon target and a sputtering gas containing high-purity nitrogen, from which hydrogen, water, a hydroxyl group, hydride, or the like is removed, between the silicon oxide film and the substrate. Also in that case, as in the case of the silicon oxide film, it is preferable to form a silicon nitride film in the state where hydrogen, water, a hydroxy group, hydride, or the like remaining in the treatment chamber is removed. Note that also in the process, the substrate 101 may be heated.

In the case where a silicon nitride film and a silicon oxide film are stacked as the base insulating film, the silicon nitride film and the silicon oxide film can be formed in the same treatment chamber with the use of a common silicon target. First, the silicon nitride film is formed in such a manner that an etching gas containing nitrogen is introduced and a silicon target mounted on the treatment chamber is used. Then, the silicon oxide film is formed in such a manner that the gas is switched to an etching gas containing oxygen and the same silicon target is used. The silicon nitride film and the silicon oxide film can be formed in succession without being exposed to air; therefore, impurities such as hydrogen, water, a hydroxyl group, or hydride can be prevented from being adsorbed on the surface of the silicon nitride film.

Next, the first gate electrode 103 is formed over the substrate 101 over which the base insulating layer 102 is formed. The first gate electrode 103 can be formed in such a manner that a conductive film is formed over the substrate 101 by a sputtering method which is a physical vapor deposition method (PVD method), a vacuum deposition method, or a chemical vapor deposition method (CVD method), a resist mask is formed over the conductive film by a first photolithography step, and the conductive film is etched (or processed) using the resist mask. Alternatively, the resist mask is formed by a printing method or an ink jet method instead of the photolithography step, so that the number of steps for forming the first gate electrode 103 can be reduced. Note that end portions of the first gate electrode 103 preferably have a tapered shape because the coverage with the gate insulating layer 105 formed later can be improved. In the case of using a photolithography step, the tapered shape can be obtained by etching while backing off the resist mask.

In this embodiment, a tungsten film having a thickness of 150 nm is formed by a sputtering method as a conductive film to be the first gate electrode 103, and then etched using the resist mask formed by the first photolithography step to form the first gate electrode 103.

The gate insulating layer 105 covering the first gate electrode 103 is formed. The gate insulating layer 105 can be formed using a method similar to that of the base insulating layer 102. When a silicon oxide layer is formed by a sputtering method, a silicon target or a quartz target is used as a target and oxygen or a mixed gas of oxygen and argon is used as a sputtering gas.

For example, a high-density plasma-enhanced CVD method using microwaves (e.g., microwaves with a frequency of 2.45 GHz) is preferably used in the case where an insulating layer is formed by a CVD method. This is because using the insulating layer, which is dense and has high breakdown voltage and high quality, as the gate insulating layer 105 provides close contact between the gate insulating layer 105 and the highly-purified oxide semiconductor layer whose hydrogen concentration is reduced, so that the interface state can be reduced and the interface characteristics can be favorable. In addition, since the insulating layer formed using a high-density plasma-enhanced CVD method can have a uniform thickness, the insulating layer has excellent step coverage. Further, as for the insulating layer formed using a high-density plasma-enhanced CVD method, the thickness can be controlled precisely.

In this embodiment, a 200-nm-thick silicon oxynitride film is formed by a sputtering method. The gate insulating layer 105 is preferably formed so that the concentration of hydrogen is reduced. The gate insulating layer 105 may be formed using a method similar to a method for forming the base insulating layer 102. For example, the gate insulating layer 105 is formed using a sputtering gas containing high-purity oxygen from which hydrogen, water, a hydroxyl group, hydride, or the like is removed, or the gate insulating layer 105 is formed while hydrogen, water, a hydroxyl group, hydride, or the like remaining in the treatment chamber is removed. Further, it is preferable that preheat treatment be performed before the gate insulating layer 105 is formed, in order to remove moisture or hydrogen which remains on an inner wall of a sputtering apparatus, on a surface of the target, or inside a target material; after the preheat treatment, the substrate or the sputtering apparatus be cooled; then, the gate insulating layer 105 be formed without exposure to the air.

Next, in the step of forming the oxide semiconductor layers 106a and 106b having high carrier density, before and after the formation of the oxide semiconductor layer 107, a set of formation of an oxide semiconductor film having high carrier density and etching thereof is performed once. First, over the gate insulating layer 105, an oxide semiconductor film having high carrier density is formed. The oxide semiconductor film having high carrier density can be formed using a method which is similar to a method for forming an oxide semiconductor film 117 to be formed later. In this embodiment, of the above-described materials, an In—Sn—O film containing $SiO_2$ is formed to have a thickness of 50 nm by a sputtering method.

Then, the oxide semiconductor film is etched with a resist mask that is formed by a second photolithography step, so that island-shaped oxide semiconductor layers 104a and 104b having high carrier density are formed. At this time, the oxide semiconductor film is preferably etched so that end portions of the island-shaped oxide semiconductor layers 104a and 104b having high carrier density are tapered. For this etching step, a wet etching process, a dry etching process, or both of them may be employed. As an etchant used for wet etching, a mixed solution of phosphoric acid, acetic acid, and nitric acid, an ammonia hydrogen peroxide mixture (31 wt % hydrogen peroxide water:28 wt % ammonia water:water=5:2:2 (volume ratio)), or the like can be used. In addition, ITO-07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium is collected from the waste liquid after the etching and reused, the resources can be efficiently used and the cost can be reduced.

As the etching gas for a dry etching process, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP) etching method can be used. In order to etch the layer into a desired shape, the etching condition (the amount of electric power applied to a coil-shaped electrode, the amount of electric power applied to an electrode on a substrate side, the temperature of the electrode on the substrate side, or the like) is adjusted as appropriate.

Next, the oxide semiconductor layer 107 is formed so as to be in contact with the island-shaped oxide semiconductor layers 104a and 104b having high carrier density and overlap with the first gate electrode 103 with the gate insulating layer 105 interposed therebetween. First, over the gate insulating layer 105 and the island-shaped oxide semiconductor layers 104a and 104b having high carrier density, the oxide semiconductor film 117 is formed by a sputtering method, a coating method, a printing method, or the like.

In this embodiment, the oxide semiconductor film 117 is formed by a sputtering method. The oxide semiconductor film 117 is formed in such a manner that a sputtering gas from which hydrogen, water, a hydroxyl group, hydride, or the like is removed is introduced into the treatment chamber and a metal oxide is used as a target while the substrate is held in the treatment chamber held in a reduced-pressure state and moisture remaining in the treatment chamber is removed. An entrapment vacuum pump is preferably used in order to remove hydrogen, water, a hydroxyl group, hydride, or the like remaining in the treatment chamber. For example, a cryopump, an ion pump, or a titanium sublimation pump is preferably used. The evacuation unit may be a turbo pump provided with a cold trap. For example, hydrogen, water, a hydroxy group, hydride, or the like (more preferably, including a compound containing a carbon atom) is exhausted from the treatment chamber with the use of a cryopump. Therefore, the concentration of impurities contained in the oxide semiconductor film 117 can be reduced. The oxide semiconductor film 117 may be formed while the substrate is heated. After preheat treatment is performed in a manner similar to the formation of the gate insulating layer 105, the oxide semiconductor film 117 may be formed.

Moreover, when the leakage rate of the treatment chamber of the sputtering apparatus is set to less than or equal to $1\times10^{-10}$ Pa·m$^3$/second, entry of impurities such as an alkali metal or hydride into the oxide semiconductor film under formation by a sputtering method can be reduced. Further, with the use of an entrapment vacuum pump as an evacuation system, counter flow of impurities such as an alkali metal, a hydrogen atom, a hydrogen molecule, water, a hydroxyl group, or a hydride from the evacuation system can be reduced.

As the target used for forming the oxide semiconductor film 117 by a sputtering method, a metal oxide target containing zinc or a metal oxide target containing zinc and indium can be used from the above description. A target containing $SiO_2$ at greater than or equal to 2 wt % and less than or equal to 10 wt % may be used. The filling rate of the target of an oxide semiconductor film is greater than or equal to 90% and less than or equal to 100%, preferably greater than or equal to 95% and less than or equal to 99.9%. The oxide semiconductor film 117 which is formed using the target of the oxide semiconductor film with high filling rate is dense.

In this embodiment, the oxide semiconductor film 117 with a thickness of 500 nm is formed using an In—Ga—Zn-based metal oxide target ($In_2O_3$:$Ga_2O_3$:ZnO=1:1:2 [molar ratio]). As the target, an In—Ga—Zn-based metal oxide target (the composition ratio is $In_2O_3$:$Ga_2O_3$:ZnO=1:1:1 [molar ratio]), an In—Ga—Zn-based metal oxide target (the composition ratio is In:Ga:Zn=1:1:0.5 [atomic ratio]), or an In—Ga—Zn-based metal oxide target (the composition ratio is In:Ga:Zn=1:1:1 [atomic ratio]) may be used.

The oxide semiconductor film 117 can be formed by a sputtering method in a rare gas (typically argon) atmosphere, an oxygen atmosphere, or an atmosphere of a rare gas (typically argon) and oxygen. It is preferable to use a high-purity gas from which an impurity such as hydrogen, water, a hydroxyl group, or hydride is removed to the degree that the impurity concentration is expressed in ppm or ppb, as a sputtering gas used when the oxide semiconductor film 117 is formed.

In this embodiment, as an example of the film formation condition, the following conditions are applied: the distance between the substrate 101 and the target is 170 mm; the substrate temperature is 250° C.; the pressure is 0.4 Pa; the direct current (DC) power is 0.5 kW; and the atmosphere contains oxygen, the atmosphere contains argon, or the atmosphere contains oxygen and argon.

As pretreatment, it is preferable that the substrate 101 formed through the steps up to and including the step of forming the gate insulating layer 105 be preheated in a preheating chamber of a sputtering apparatus and impurities such as hydrogen, water, a hydroxyl group, or hydride adsorbed on the substrate 101 be eliminated and removed so that hydrogen is contained in the oxide semiconductor film 117 as little as possible. As an evacuation unit provided in the preheating chamber, a cryopump is preferable. Note that this preheating treatment can be omitted. In addition, the preheating step may be performed on the substrate 101 over which the first gate electrode 103 has not been formed, or may be performed on the substrate 101 over which a conductive film serving as the source electrode 109a and the drain electrode 109b has not been formed.

Note that before the oxide semiconductor film 117 is formed by a sputtering method, reverse sputtering in which plasma is generated by introduction of an argon gas is preferably performed, and particles attached to the surfaces of the gate insulating layer 105 are removed, so that resistance at the interface between the gate insulating layer 105 and the oxide semiconductor layer 107 can be reduced. The reverse sputtering refers to a method of modifying a surface of a substrate by applying a voltage to the substrate using an RF power source in an argon atmosphere to form plasma in a vicinity of the substrate. Note that instead of an argon atmosphere, a nitrogen atmosphere, a helium atmosphere, or the like may be used. Alternatively, an argon atmosphere to which oxygen, hydrogen, nitrous oxide, or the like is added may be used. An argon atmosphere to which chlorine, carbon tetrafluoride, or the like is added may be used.

Figure 3A:
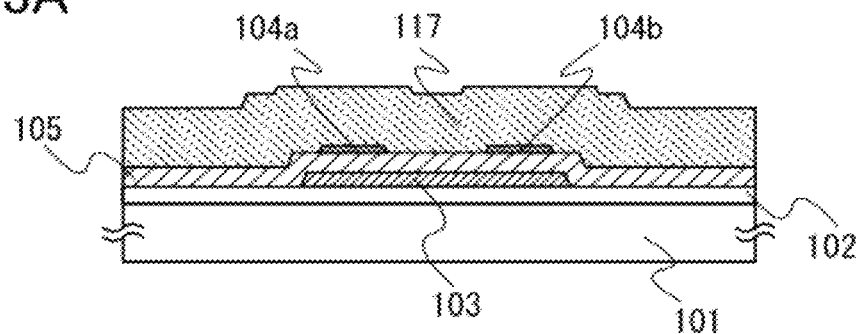
FIGS. 3A to 3D are cross-sectional views illustrating a method for manufacturing a transistor which is one embodiment of the present invention.

The structure obtained through the steps up to here is illustrated in FIG. 3A.

Then, the oxide semiconductor film is etched using a resist mask formed by a third photolithography step, so that an island-shaped oxide semiconductor layer is formed. The third photolithography step for the island-shaped oxide semiconductor layer may be similar to the other photolithography steps. A step for etching the oxide semiconductor film 117 may be performed in a manner similar to the formation of the island-shaped oxide semiconductor layers 104a and 104b having high carrier density. At this time, etching is preferably performed so that an end portion of the island-shaped oxide semiconductor layer has a tapered shape.

Next, first heat treatment is performed on the island-shaped oxide semiconductor layer to form the oxide semiconductor layer 107.

The temperature of the first heat treatment is higher than or equal to 400° C. and lower than or equal to 750° C., preferably higher than or equal to 400° C. and lower than the strain point of the substrate. Here, the substrate is introduced into an electric furnace that is a kind of heat treatment apparatus and heat treatment is performed on the island-shaped oxide semiconductor layer at 450° C. in an atmosphere of an inert gas such as nitrogen or a rare gas for one hour. Then, the oxide semiconductor layer is not exposed to air; accordingly, hydrogen, water, a hydroxyl group, hydride, or the like can be prevented from entering the island-shaped oxide semiconductor layer. Accordingly, the oxide semiconductor layer 107 whose hydrogen concentration is reduced and which is purified and made i-type or substantially i-type can be obtained. In other words, at least one of dehydration and dehydrogenation of the island-shaped oxide semiconductor layer can be performed by this first heat treatment.

Note that it is preferable that in the first heat treatment, hydrogen, water, a hydroxyl group, hydride, or the like be not contained in nitrogen or a rare gas such as helium, neon, or argon. The purity of nitrogen or a rare gas such as helium, neon, or argon introduced into the heat treatment apparatus is preferably 6N (99.9999%) or more, more preferably 7N (99.99999%) or more (i.e., the impurity concentration is preferably 1 ppm or less, more preferably 0.1 ppm or less).

Further, the first heat treatment of the island-shaped oxide semiconductor layer may be performed before the island-shaped oxide semiconductor layer is formed. In other words, the first heat treatment may be performed on the oxide semiconductor film 117. In that case, after the first heat treatment, the substrate is taken out of the heat treatment apparatus, and then a third photolithography step is performed, so that etching is performed to form the island-shaped oxide semiconductor layer.

There is no particular limitation on the heat treatment apparatus used for the first heat treatment and an apparatus for heating an object to be processed by thermal conduction or thermal radiation from a heater such as a resistance heater can be used. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Figure 3B:
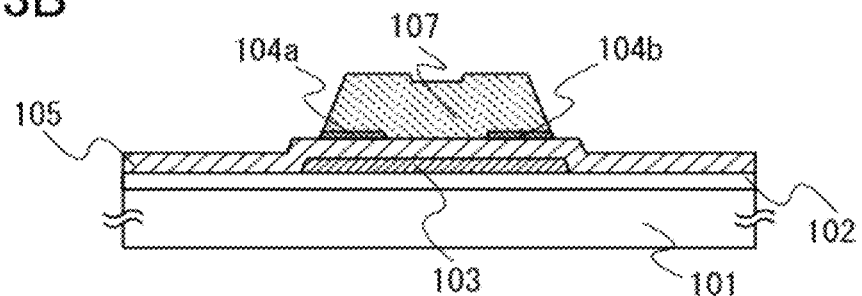

The structure obtained through the steps up to here is illustrated in FIG. 3B.

Next, in order to form the oxide semiconductor layers 106a and 106b having high carrier density, a 50-nm-thick oxide semiconductor film having high carrier density is formed again by a method which is similar to the above method. In this process, the oxide semiconductor film having high carrier density and the island-shaped oxide semiconductor layers 104a and 104b having high carrier density are bonded to each other and processed into a desired shape, so that the oxide semiconductor layers 106a and 106b having high carrier density are formed.

Next, a conductive film for forming the source electrode 109a and the drain electrode 109b is formed in contact with the gate insulating layer 105 and the oxide semiconductor layer 107. The conductive film may be formed by a method which is similar to the method for forming the first gate electrode 103. In this embodiment, a titanium film with a thickness of 150 nm is formed by a sputtering method. Then, the formed conductive film (here, the titanium film) is etched using a resist mask formed by a fourth photolithography step, so that the source electrode 109a and the drain electrode 109b are formed. At this time, etching is preferably performed so that end portions of the source electrode 109a and the drain electrode 109b are tapered.

Further, the oxide semiconductor film having high carrier density which is formed over the oxide semiconductor layer 107 is etched using the source electrode 109a and the drain electrode 109b as masks, so that the oxide semiconductor layers 106a and 106b having high carrier density are formed to cover the end portions of the oxide semiconductor layer 107. Here, the source electrode 109a and drain electrode 109 are used as masks; therefore, tapered portions of the oxide semiconductor layers 106a and 106b having high carrier density formed over the oxide semiconductor layer 107 are formed to protrude from the source electrode 109a and the drain electrode 109b, in some cases. In this process, it is possible that the etching rate of the oxide semiconductor layer 107 is substantially equal to the etching rate of the oxide semiconductor film having high carrier density formed over the oxide semiconductor layer 107. Thus, it is preferable that the oxide semiconductor film be processed with appropriate adjustment of the etching time with reference to the etching rate of the oxide semiconductor film having high carrier density when the oxide semiconductor layers 106a and 106b having high carrier density are formed.

Figure 3C:
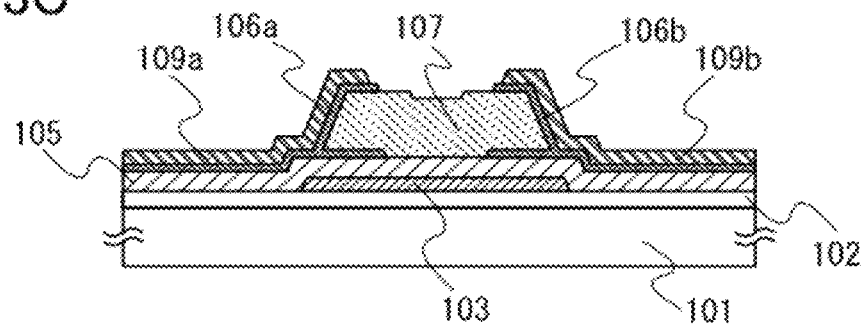

The structure obtained through the steps up to here is illustrated in FIG. 3C.

Next, the insulating layer 111 is formed in contact with part of the oxide semiconductor layer 107, parts of the oxide semiconductor layers 106a and 106b having high carrier density, the source electrode 109a, and the drain electrode 109b. The insulating layer 111 can be formed by a method which is similar to those of the base insulating layer 102 and the gate insulating layer 105. In this embodiment, a 200-nm-thick silicon oxide film is formed by a sputtering method.

After that, heat treatment whose heat temperature is different from that of the first heat treatment is preferably performed. By the heat treatment, oxygen is supplied from the gate insulating layer 105 and the insulating layer 111 to the oxide semiconductor layer 107. Also, the higher the temperature of the heat treatment, the more suppressed an amount of change becomes in a threshold voltage (Vth) due to light irradiation or application of BT stress. However, when the heat temperature of the heat treatment is higher than 320° C., the on-state characteristics are degraded. Thus, the heat treatment is performed under the conditions that the atmosphere is an inert atmosphere, an oxygen atmosphere, or a mixed atmosphere of oxygen and nitrogen, and the heat temperature is higher than or equal to 200° C. and lower than or equal to 400° C., preferably higher than or equal to 250° C. and lower than or equal to 320° C. In addition, time of the heat treatment is longer than or equal to 1 minute and shorter than or equal to 24 hours. Note that the heat treatment may be performed after the formation of the second gate electrode 113 to be formed later.

In addition, a silicon nitride film may be formed over the insulating layer 111 to prevent the entry of moisture or an alkali metal into the oxide semiconductor layer 107. Since an alkali metal such as Li or Na is an impurity, the content of such an alkali metal in the oxide semiconductor layer 107 is preferably reduced. The concentration of the alkali metal in the oxide semiconductor layer 107 is $2 \times 10^{16}$ cm$^{-3}$ or lower, preferably $1 \times 10^{15}$ cm$^{-3}$ or lower. Further, the content of an alkaline earth metal in the oxide semiconductor layer 107 is preferably low because the alkaline earth metal is also an impurity. Note that after the second gate electrode 113 described later is formed, the silicon nitride film may be formed as the protective insulating layer.

Next, the second gate electrode 113 functioning as a back gate electrode is formed in contact with the insulating layer 111 and between the source electrode and the drain electrode. The second gate electrode 113 is formed in such a manner that a conductive film is formed over the insulating layer 111 and then the formed conductive film is etched using a resist mask formed by a fifth photolithography step. The second gate electrode 113 can be formed by a method which is similar to those of the first gate electrode 103, the source electrode 109a, and the drain electrode 109b. In this embodiment, the second gate electrode 113 is formed using a 150-nm-thick molybdenum film by a sputtering method.

Figure 3D:
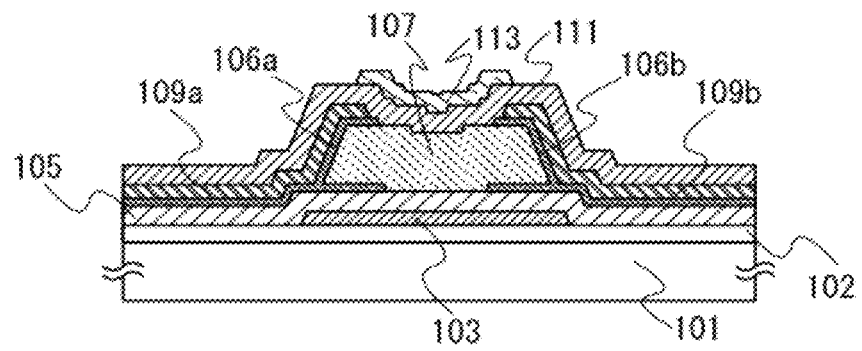

The structure obtained through the steps up to here is illustrated in FIG. 3D.

Thus, a transistor in which a decrease of the on-state current can be suppressed and which has high breakdown voltage characteristics (drain breakdown voltage) can be formed. Note that this embodiment can be implemented in combination with any of the structures described in other embodiments, as appropriate.

Embodiment 2

In this embodiment, a transistor 200 having a structure which is partly different from the structure of the transistor 100 described in Embodiment 1 will be described.

In the transistor 200 described in this embodiment, the oxide semiconductor layer 107 of the transistor 100 described in Embodiment 1 includes a crystalline oxide semiconductor. The crystalline oxide semiconductor can be formed by the following two types of methods.

One method is to form a crystalline oxide semiconductor film in such a way that an oxide semiconductor is formed twice and heat treatment is performed twice (this method is referred to as a method 1 for convenience), whereas the other is to form a crystalline oxide semiconductor film in such a way that a substrate is heated when an oxide semiconductor is formed (this method is referred to as a method 2 for convenience). Note that the crystalline oxide semiconductor film obtained by any of the above methods has a region in which crystals are aligned perpendicular to a film surface in the c-axis direction and is neither single crystalline nor amorphous. In other words, with any of the above methods, the formed crystalline oxide semiconductor includes an oxide including a crystal with c-axis alignment (also referred to as C-Axis Aligned Crystal (CAAC)). Thus, in this embodiment, the crystalline oxide semiconductor layer (CAAC layer) which forms a channel region of the transistor 200 serves as a crystalline oxide semiconductor layer 130.

Figure 4A:
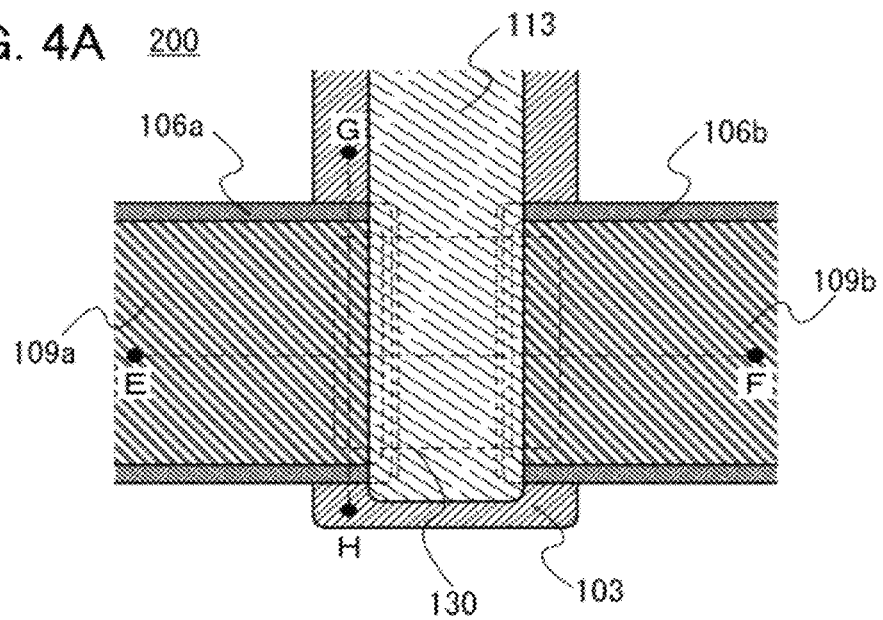
FIGS. 4A to 4C are a plan view and cross-sectional views illustrating a transistor which is one embodiment of the present invention.
Figure 4B:
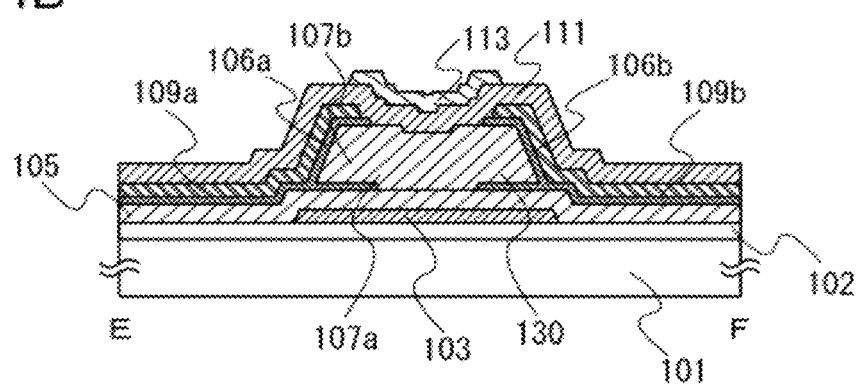
Figure 4C:
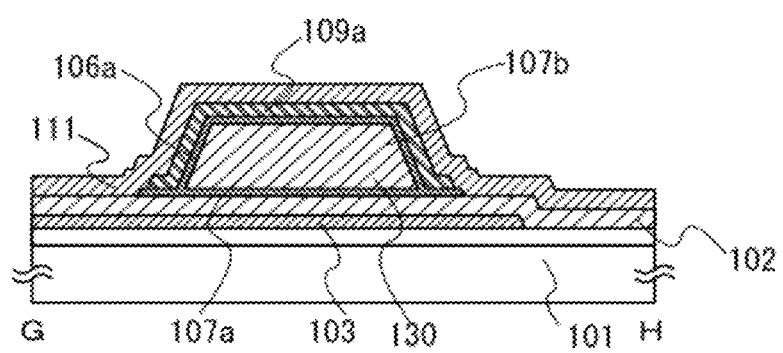

A planar structure of the transistor 200 is similar to a planar structure of the transistor 100. FIG. 4A is a plan view of the transistor 200. FIG. 4B is a cross-sectional view taken along line E-F in the transistor 200. FIG. 4C is a cross-sectional view taken along line G-H in the transistor 200. Note that in FIGS. 4A to 4C, the same reference numerals are used for the same parts in FIGS. 1A to 1C.

The transistor 200 described in this embodiment can be said to be a transistor in which the crystalline oxide semiconductor layer 130 is used instead of the oxide semiconductor layer 107 of the transistor 100 in Embodiment 1. Therefore, in this embodiment, only the crystalline oxide semiconductor layer 130 is described, and the description of the cross-sectional structure taken along line A-B and the cross-sectional structure taken along line C-D of the transistor 100 described in Embodiment 1 can be referred to for the details of the cross-sectional structure taken along line E-F and the cross-sectional structure taken along line G-H of the transistor 200.

The transistor 200 has the same structure as the transistor 100 except that the oxide semiconductor layer 107 in the transistor 100 is changed to the crystalline oxide semiconductor layer 130; therefore, the effect of the transistor 200 is similar to that of the transistor 100. In other words, in the transistor 200, since the oxide semiconductor layers 106a and 106b having high carrier density cover the crystalline oxide semiconductor layer 130 and are in contact with the source electrode 109a and the drain electrode 109b, the contact resistance between the crystalline oxide semiconductor layer 130 and the source electrode 109a and the drain electrode 109b can be reduced. Therefore, the decrease of the on-state current which is generated by the contact resistance can be suppressed.

Further, when parts of the oxide semiconductor layers 106a and 106b having high carrier density are formed between the gate insulating layer 105 and the crystalline oxide semiconductor layer 130, the decrease of the on-state current due to the resistance of the semiconductor layer in the thickness direction of the semiconductor layer can be suppressed.

As described in Embodiment 1, when the oxide semiconductor layers 106a and 106b having high carrier density are formed using any of metal materials, an alloy material thereof, and the like, an effect of suppressing a decrease of the on-state current cannot be sufficiently obtained due to the contact resistance with the crystalline oxide semiconductor layer 130. Therefore, it is preferable that the oxide semiconductor layers 106a and 106b having high carrier density be formed in part of a portion between the gate insulating layer 105 and the oxide semiconductor layer 107.

Since the transistor 200 is a dual-gate transistor having the first gate electrode 103 and the second gate electrode 113, channel regions can be formed in the vicinity of the interface between the crystalline oxide semiconductor layer 130 and the gate insulating layer 105 and in the vicinity of the interface between the crystalline oxide semiconductor layer 130 and the insulating layer 111, so that the on-state current of the transistor 200 can be improved.

Since the transistor 200 includes the crystalline oxide semiconductor layer 130 which will be described later, the decrease of the on-state current is suppressed, the on-state current is improved, and reliability is favorable.

Here, a method for manufacturing the crystalline oxide semiconductor layer 130 is additionally described.

In the method 1, a first oxide semiconductor film is formed; the first heat treatment is performed at higher than or equal to 400° C. and lower than or equal to 750° C. under an atmosphere of nitrogen, oxygen, a rare gas, or dry air; and a first crystalline oxide semiconductor film having a crystalline region (including a plate crystal) is formed in a region including a surface of the first oxide semiconductor film. The first heat treatment is similar to that in Embodiment 1. A second oxide semiconductor film which is thicker than the first oxide semiconductor film is formed; the second heat treatment is performed at higher than or equal to 400° C. and lower than or equal to 750° C.; crystal growth proceeds upward with the use of the first oxide semiconductor film as a seed crystal for the crystal growth; and the whole second oxide semiconductor film is crystallized (the second crystalline oxide semiconductor film is formed). Accordingly, the oxide semiconductor film having a large thickness and a crystalline region can be formed, and the oxide semiconductor film having a large thickness and a crystalline region is processed into a desired shape, so that the crystalline oxide semiconductor layer 130 can be formed. In addition, the thicknesses of the first crystalline oxide semiconductor film and the second crystalline oxide semiconductor film, that is, the thickness of the crystalline oxide semiconductor layer 130 can be determined as appropriate in consideration of desired breakdown voltage characteristics (drain breakdown voltage) of the transistor 200 (e.g., the thickness may be greater than or equal to 0.2 μm and less than or equal to 10 μm). Materials used for the first crystalline oxide semiconductor film and the second crystalline oxide semiconductor film may be the material containing zinc or the material containing zinc and indium which are selected from the metal oxide materials described in Embodiment 1.

Note that in the method 1, Embodiment 1 can be referred to for a method for forming the first oxide semiconductor film and the second oxide semiconductor film, the first heat treatment, and the second heat treatment, as appropriate.

Next, the method 2 is described. A crystalline oxide semiconductor film having a region in which crystals are aligned perpendicularly to the surface of the film in the c-axis direction can be formed in such a way that an oxide semiconductor film is formed while the substrate is heated at a temperature at which crystals in the material containing zinc or the material containing zinc and indium selected from the oxide semiconductor materials described in Embodiment 1 are aligned in the c-axis direction. Then, the crystalline oxide semiconductor film is processed into a desired shape, whereby the crystalline oxide semiconductor layer 130 can be formed. In addition, the number of steps can be reduced using such a formation method. Note that Embodiment 1 can be referred to for a method for forming the crystalline oxide semiconductor film, as appropriate. Although the temperature at which the substrate is heated may be set as appropriate because other film formation conditions vary depending on a film formation apparatus, for example, the substrate heating temperature used when the crystalline oxide semiconductor film is formed in a sputtering apparatus is 100° C. to 500° C., preferably 200° C. to 400° C., more preferably 250° C. to 300° C. In addition to the substrate heating performed when the crystalline oxide semiconductor film is formed, the deposited oxide semiconductor film is subjected to heat treatment at a temperature higher than the substrate heating temperature used when the crystalline oxide semiconductor film is formed. Therefore, microdefects in the film and defects at the interface of a stacked layer can be compensated.

Figure 5A:
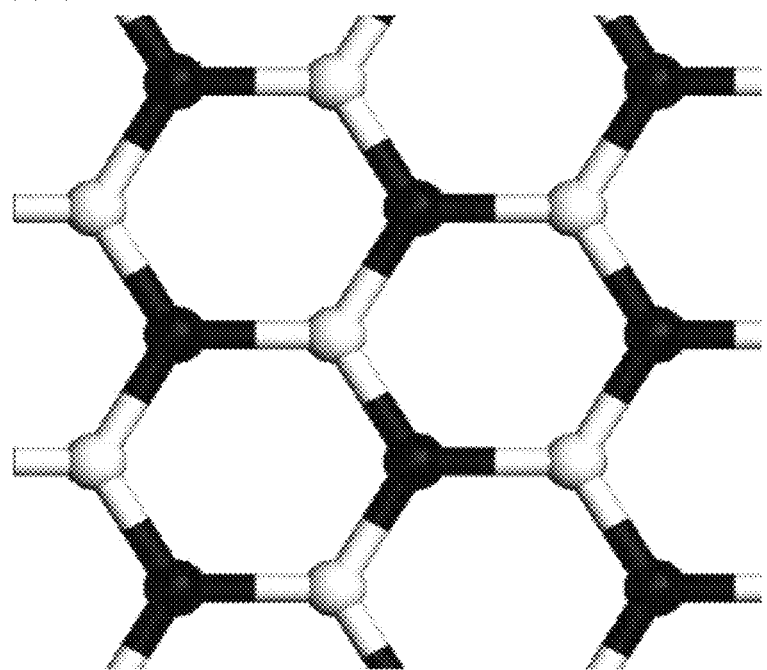
FIGS. 5A and 5B illustrate two-dimensional crystal.
Figure 5B:
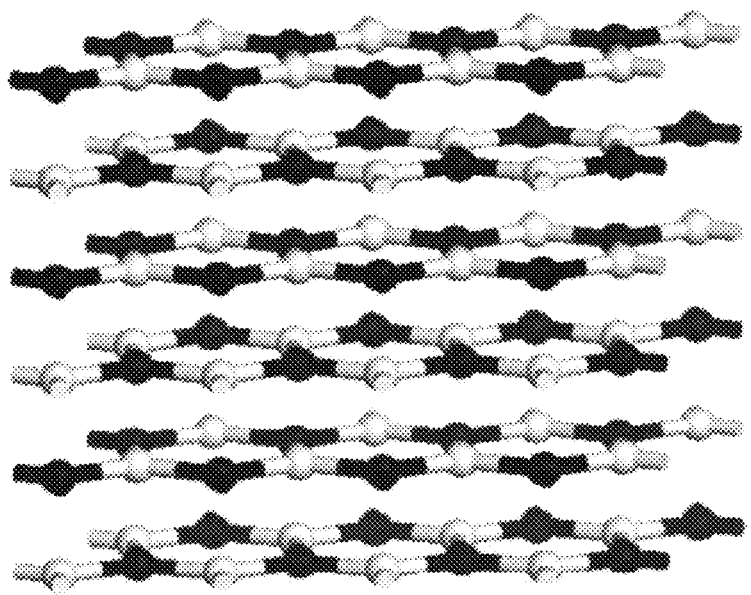

In the crystalline oxide semiconductor layer 130, a large amount of zinc and oxygen gather to the surface of the crystalline oxide semiconductor layer 130, and one or more layers of graphene-type two-dimensional crystal including zinc and oxygen and having a hexagonal upper plane (a schematic plan view thereof is illustrated in FIG. 5A) are formed at the outermost surface; the layers of crystal at the outermost surface grow in the thickness direction to be stacked. In FIG. 5A, a white circle indicates a zinc atom, and a black circuit indicates an oxygen atom. By increasing the temperature of the heat treatment, crystal growth proceeds from the surface to the inside and further from the inside to the bottom. Further, FIG. 5B schematically illustrates a stack of six layers of two-dimensional crystal as an example of a stacked layer in which two-dimensional crystal has grown.

The crystalline oxide semiconductor layer 130 has higher orderliness of a bond between metal and oxygen in a direction along the interface. Therefore, in the transistor 200 described in this embodiment, in the case where carriers flow along the interface of the crystalline oxide semiconductor layer 130, that is, in the case where carriers flow substantially parallel to the a-b plane, the crystalline oxide semiconductor layer 130 does not prevent the flow; therefore, degradation in the characteristics of the transistor is suppressed or reduced even when light irradiation is performed or BT stress is applied. In other words, the transistor 200 can be said to have favorable reliability.

The transistor 200 can be formed by using a method for manufacturing the crystalline oxide semiconductor layer 130 instead of the method for manufacturing the oxide semiconductor layer 107 in the method for manufacturing the transistor 100. Therefore, Embodiment 1 can be referred to, as appropriate, for manufacturing methods except the method for manufacturing the crystalline oxide semiconductor layer 130.

Thus, a transistor in which a decrease of the on-state current can be suppressed and which has high breakdown voltage characteristics (drain breakdown voltage) can be formed. Note that this embodiment can be implemented in combination with any of the structures described in other embodiments, as appropriate.

Embodiment 3

In this embodiment, an application of the transistor described in any of the embodiments will be described. The transistor described in any of the embodiments can be used as a power device to protection circuits of batteries of various electronic devices, for example.

An example of an application in which the transistor described in any of the embodiments is used as part of a protection circuit is described with reference to FIGS. 9A and 9B.

Figure 9A:
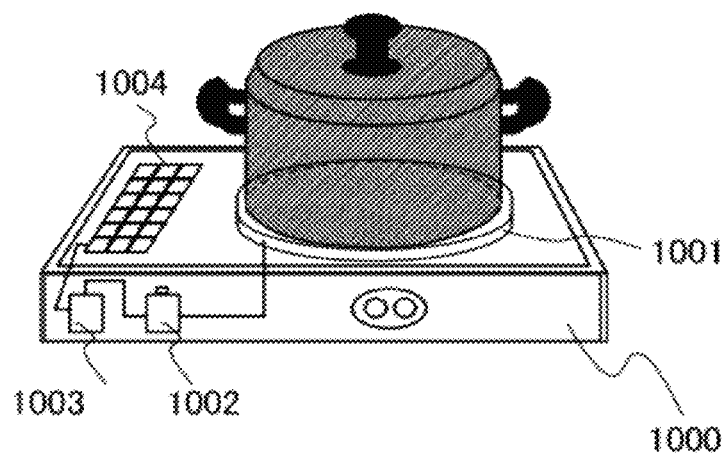
FIGS. 9A and 9B illustrate electronic devices using a transistor which is one embodiment of the present invention.

FIG. 9A illustrates an electromagnetic cooker 1000. The electromagnetic cooker 1000 heats cookware and the like by using electromagnetic induction generated by current flowing through a coil unit 1001. The electromagnetic cooker 1000 includes a battery 1002 for supplying current that is to flow through the coil unit 1001, a semiconductor device 1003 in which the transistor of one embodiment of the present invention serves as part of a protective circuit, and a solar battery 1004 for charging the battery 1002. Note that FIG. 9A illustrates the solar battery 1004 as a means to charge the battery 1002; alternatively, the battery 1002 may be charged by another means. The semiconductor device 1003 in which the transistor of one embodiment of the present invention serves as part of a protective circuit can reduce application of overvoltage to the battery 1002; thus, it is possible to reduce power consumption when the protective circuit is not operated.

Figure 9B:
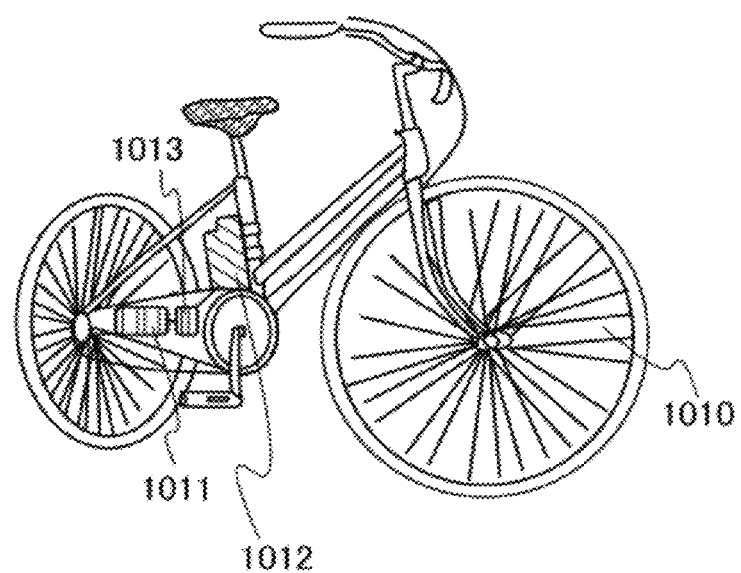

FIG. 9B illustrates an electric bicycle 1010. The electric bicycle 1010 obtains power when current flows through a motor unit 1011. The electric bicycle 1010 includes a battery 1012 for supplying current that is to flow through the motor unit 1011 and a semiconductor device 1013 in which the transistor of one embodiment of the present invention serves as part of a protective circuit. Although a means to charge the battery 1012 is not particularly illustrated in FIG. 9B, the battery 1012 may be charged by an electric generator or the like that is additionally provided. The semiconductor device 1013 in which the transistor of one embodiment of the present invention serves as part of a protective circuit can reduce application of overvoltage to the battery 1012 in charging; thus, it is possible to reduce power consumption when the protective circuit is not operated.

The example of the application described in this embodiment is an example and one embodiment of the present invention is not limited thereto. The transistor of one embodiment of the present invention can be used for various semiconductor devices for high power application.

Note that this embodiment can be implemented in combination with any of the structures described in other embodiments, as appropriate.

Embodiment 4

In this embodiment, a metal oxide (oxide semiconductor) which can be used for the oxide semiconductor layer 107 and the crystalline oxide semiconductor layer 130 of the transistors described in the embodiments will be additionally described. As described above, an oxide semiconductor preferably contains at least indium (In) or zinc (Zn). In particular, In and Zn are preferably contained.

In addition, as a stabilizer for reducing the variation in electrical characteristics of a transistor including the oxide semiconductor, one or more elements selected from gallium (Ga), tin (Sn), hafnium (Hf), aluminum (Al), and lanthanoid in addition to In and Zn is/are preferably included.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For example, as a single-component metal oxide as described above, indium oxide, tin oxide, zinc oxide, or the like can be used.

For example, as a two-component metal oxide, a Zn—Mg-based metal oxide, a Sn—Mg-based metal oxide, an In—Mg-based metal oxide, a metal oxide, or the like in addition to the above described In—Zn-based metal oxide, In—Ga-based metal oxide, Sn—Zn-based metal oxide, and Al—Zn-based metal oxide can be used.

For example, as a three-component metal oxide, in addition to the above-described In—Ga—Zn-based metal oxide (also referred to as IGZO), In—Sn—Zn-based metal oxide (also referred to as ITZO), Sn—Ga—Zn-based metal oxide, In—Al—Zn-based metal oxide, Al—Ga—Zn-based metal oxide, and Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, or the like can be used.

For example, as a four-component metal oxide, in addition to the above-described In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, an In—Hf—Al—Zn-based metal oxide, or the like can be used.

For example, in the In—Ga—Zn-based metal oxide, an In—Ga—Zn-based metal oxide with an atomic ratio of In:Ga:Zn=1:1:1 ($=1/3:1/3:1/3$) or In:Ga:Zn=2:2:1 ($=2/5:2/5:1/5$), or any of metal oxides whose composition is in the neighborhood of the above compositions can be used.

In the In—Sn—Zn-based metal oxide, an In—Sn—Zn-based metal oxide with an atomic ratio of In:Sn:Zn=1:1:1 ($=1/3:1/3:1/3$), In:Sn:Zn=2:1:3 ($=1/3:1/6:1/2$), or In:Sn:Zn=2:1:5 ($=1/4:1/8:5/8$), or any of metal oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either a single crystal or a non-single-crystal.

In the case of non-single-crystal, the oxide semiconductor may be either amorphous or polycrystal. Further, the oxide semiconductor may have an amorphous structure including a portion having crystallinity. Note that the amorphous structure has many defects; therefore, a non-amorphous structure is preferred.

The contents of this embodiment or part thereof can be implemented in combination with any of the other embodiments and examples.

Embodiment 5

The crystalline oxide semiconductor layer 130 described in Embodiment 2 will be additionally described. The crystalline oxide semiconductor layer 130 includes an oxide including CAAC. The CAAC has a crystalline portion and a non-crystalline portion, and the crystalline portion has c-axis alignment.

The oxide including CAAC is a new oxide semiconductor which has not been known until now.

The CAAC has c-axis alignment and a triangular or hexagonal atomic arrangement when seen from the direction of an a-b plane, a surface, or an interface may be used.

In the CAAC, metal atoms are arranged in a layered manner, or metal atoms and oxygen atoms are arranged in a layered manner along the c-axis.

In the CAAC, the direction of the a-axis or the b-axis is varied in the a-b plane (the crystal rotates around the c-axis).

The CAAC is a non-single-crystal in the broad sense.

The CAAC has a triangular, hexagonal, regular triangular or regular hexagonal atomic arrangement when seen from the direction perpendicular to the a-b plane.

In the CAAC, metal atoms are arranged in a layered manner or metal atoms and oxygen atoms are arranged in a layered manner when seen from the direction perpendicular to the c-axis direction.

The CAAC is not a single crystal, but this does not mean that CAAC is composed of only an amorphous component.

Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC.

The c-axes of individual crystalline portions included in the CAAC may be aligned in one direction (e.g., a direction perpendicular to a surface of a substrate over which the CAAC is formed or a surface of the CAAC).

Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

For example, CAAC which is formed into a film shape has a triangular or hexagonal atomic arrangement when observed from the direction perpendicular to a surface of the film or a surface of a supporting substrate with an electron microscope.

Further, metal atoms are arranged in a layered manner or metal atoms and oxygen atoms (or nitrogen atoms) are arranged in a layered manner when a cross section of the film is observed with an electron microscope.

An example of a crystal structure of the CAAC will be described with reference to FIGS. 10A to 10E, FIGS. 11A to 11C, and FIGS. 12A to 12C.

In FIGS. 10A to 10E, FIGS. 11A to 11C, and FIGS. 12A to 12C, the vertical direction corresponds to the c-axis direction and a plane perpendicular to the c-axis direction corresponds to the a-b plane. In this embodiment, the expressions an "upper half" and a "lower half" refer to an upper half above the a-b plane and a lower half below the a-b plane, respectively.

Figure 10A:
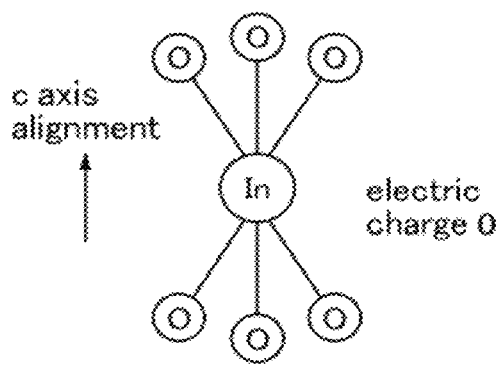
FIGS. 10A to 10E are examples of an oxide semiconductor.

FIG. 10A illustrates a structure A including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure A is an octahedral structure, but is illustrated as a planar structure for simplicity. Note that three tetracoordinate O atoms exist in each of an upper half and a lower half in the structure A. In the small group of the structure A, electric charge is 0.

Figure 10D:
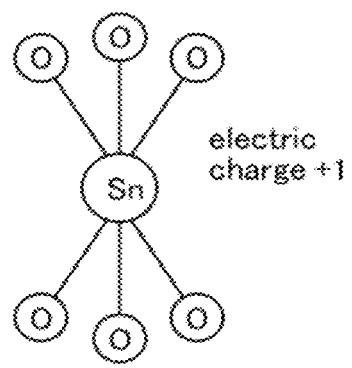
Figure 10B:
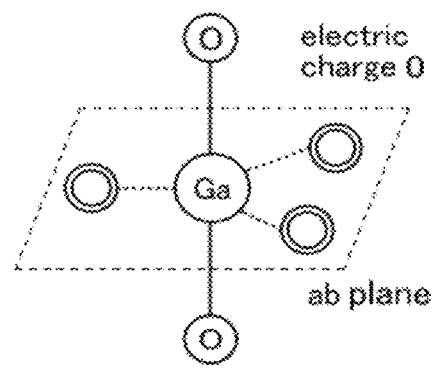

FIG. 10B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in the structure B. An In atom can also have the structure B because an In atom can have five ligands. In the small group of the structure B, electric charge is 0.

Figure 10E:
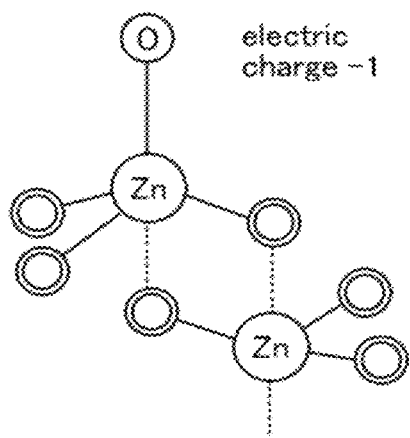
Figure 10C:
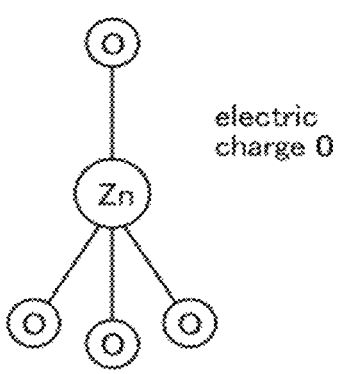

FIG. 10C illustrates a structure C including one tetracoordinate Zn atom and four tetracoordinate O atoms proximate to the Zn atom. In the structure C, one tetracoordinate O atom exists in an upper half and three tetracoordinate O atoms exist in a lower half. In the small group of the structure C, electric charge is 0.

FIG. 10D illustrates a structure D including one hexacoordinate Sn atom and six tetracoordinate O atoms proximate to the Sn atom. In the structure D, three tetracoordinate O atoms exist in each of an upper half and a lower half. In the small group of the structure D, electric charge is +1.

FIG. 10E illustrates a structure E including two Zn atoms. In the structure E, one tetracoordinate O atom exists in each of an upper half and a lower half. In the small group of the structure E, electric charge is −1.

In this embodiment, a plurality of small groups form a medium group, and a plurality of medium groups form a large group (also referred to as a unit cell).

Now, a rule of bonding between the small groups will be described. The three O atoms in the upper half with respect to the hexacoordinate In atom each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms; similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 11A illustrates a model of a medium group A included in a layered structure of an In—Sn—Zn-based metal oxide. FIG. 11B illustrates a large group B including three medium groups. Note that FIG. 11C illustrates an atomic arrangement in the case where the layered structure in FIG. 11B is observed from the c-axis direction.

In FIG. 11A, a tricoordinate O atom is omitted, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 11A, one tetracoordinate O atom existing in each of an upper half and a lower half with respect to an In atom is denoted by circled 1. FIG. 11A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based metal oxide in FIG. 11A, in the order starting from the top, a Sn atom proximate to three tetracoordinate O atoms in each of an upper half and a lower half is bonded to an In atom proximate to one tetracoordinate O atom in each of an upper half and a lower half. The In atom is bonded to a Zn atom proximate to three tetracoordinate O atoms in an upper half. The Zn atom is bonded to an In atom proximate to three tetracoordinate O atoms in each of an upper half and a lower half through one tetracoordinate O atom in a lower half with respect to the Zn atom. The In atom is bonded to a small group that includes two Zn atoms and is proximate to one tetracoordinate O atom in an upper half. The small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in the structure E can be given. For example, with one small group including two Zn atoms, electric charge of one small group including a Sn atom can be cancelled, so that the total electric charge of the layered structure can be 0.

When the large group illustrated in FIG. 11B is repeated, an In—Sn—Zn-based metal oxide crystal ($In_2SnZn_3O_8$) can be obtained. Note that a layered structure of the obtained In—Sn—Zn-based metal oxide can be expressed as a composition formula, $In_2SnZn_2O_7(ZnO)_m$ (m is 0 or a natural number).

As larger m is, the crystallinity of the In—Sn—Zn-based metal oxide crystal is improved, which is preferable.

The same is applied to the case where an oxide semiconductor other than the In—Sn—Zn-based metal oxide is used.

Figure 12A:
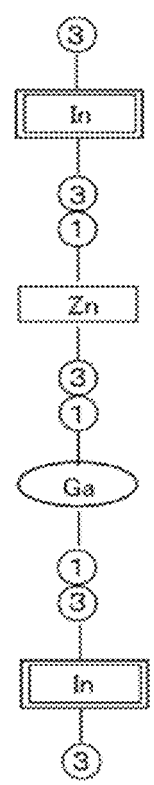
FIGS. 12A to 12C are examples of an oxide semiconductor.

As an example, FIG. 12A illustrates a model of a medium group included in a layered structure of an In—Ga—Zn-based metal oxide.

In the medium group included in the layered structure of the In—Ga—Zn—O-based material in FIG. 12A, in the order starting from the top, an In atom proximate to three tetracoordinate O atoms in each of an upper half and a lower half is bonded to a Zn atom proximate to one tetracoordinate O atom in an upper half. The Zn atom is bonded to a Ga atom proximate to one tetracoordinate O atom in each of an upper half and a lower half through three tetracoordinate O atoms in a lower half with respect to the Zn atom. The Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 12B:
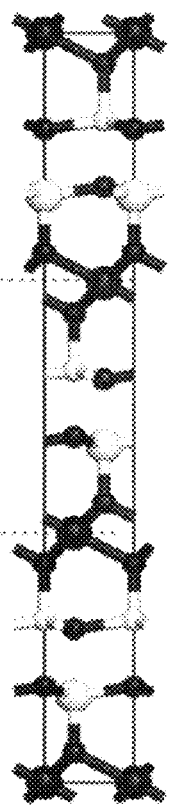
Figure 12C:
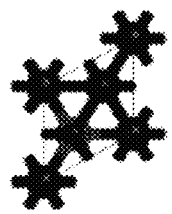

FIG. 12B illustrates a large group including three medium groups. Note that FIG. 12C illustrates an atomic arrangement in the case where the layered structure in FIG. 12B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based metal oxide, a large group can be formed using not only the medium group illustrated in FIG. 12A but also a medium group in which the arrangement of the In atom, the Ga atom, and the Zn atom is different from that in FIG. 12A.

When the large group illustrated in FIG. 12B is repeated, an In—Ga—Zn-based metal oxide crystal can be obtained. Note that a layered structure of the obtained In—Ga—Zn-based metal oxide can be expressed as a composition formula, $InGaO_3(ZnO)_n$ (n is a natural number).

Figure 21A:
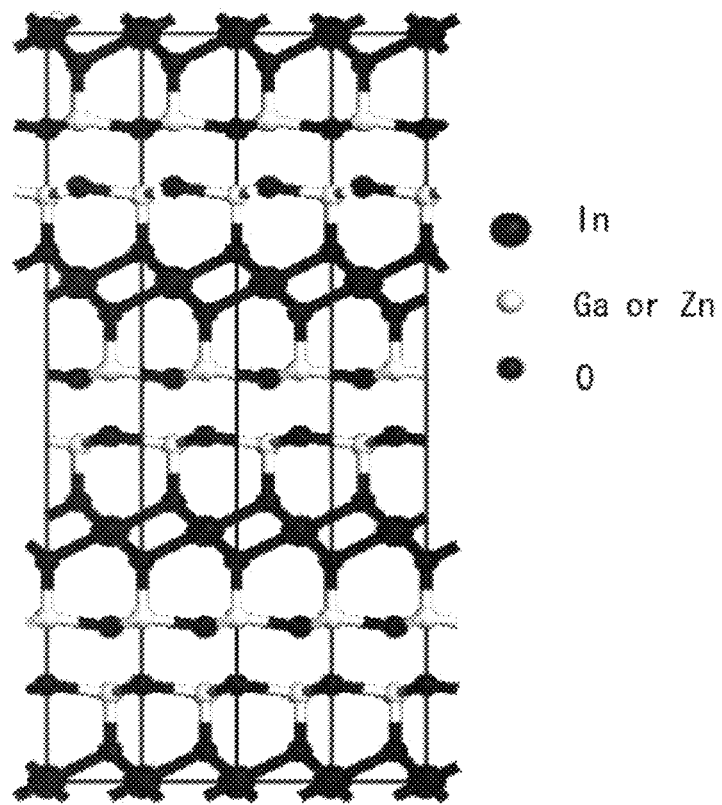
FIGS. 21A and 21B illustrate examples of an oxide semiconductor.

In the case where n=1 ($InGaZnO_4$), a crystal structure illustrated in FIG. 21A can be obtained, for example. Note that in the crystal structure in FIG. 21A, since a Ga atom and an In atom each have five ligands as described in FIG. 10B, a structure in which Ga is replaced with In can be obtained.

Figure 21B:
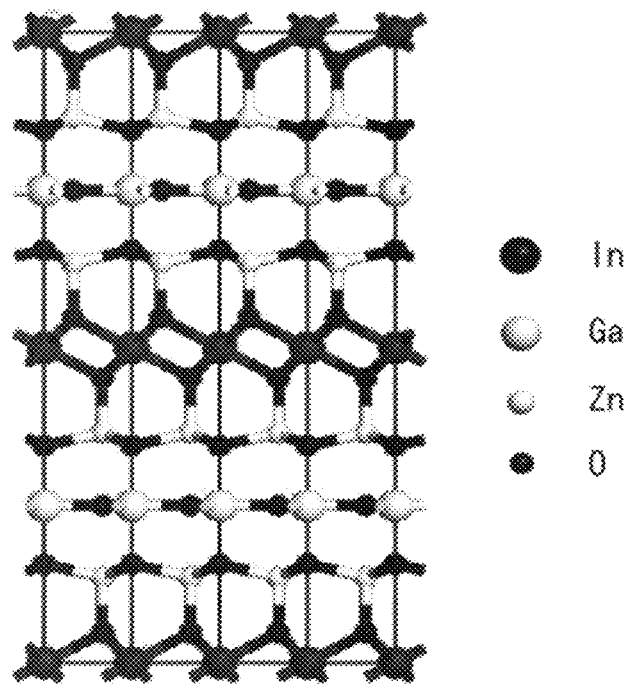

In the case where n=2 ($InGaZn_2O_5$), a crystal structure illustrated in FIG. 21B can be obtained, for example. Note that in the crystal structure in FIG. 21B, a Ga atom and an In atom each have five ligands as described in FIG. 10B, a structure in which Ga is replaced with In can be obtained.

The contents of this embodiment or part thereof can be implemented in combination with any of the other embodiments and examples.

Embodiment 6

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as equation (1).

[FORMULA 1]

$$\mu = \mu_0 \exp\left(-\frac{E}{kT}\right) \quad (1)$$

Here, E represents the height of the potential barrier, k represents the Boltzmann constant, and T represents the absolute temperature.

When the potential barrier is assumed to be attributed to a defect, the height of the potential barrier can be expressed as equation (2) according to the Levinson model.

[FORMULA 2]

$$E = \frac{e^2 N^2}{8\varepsilon n} = \frac{e^3 N^2 t}{8\varepsilon C_{ox} V_g} \quad (2)$$

Here, e represents the elementary charge, N represents the average defect density per unit area in a channel, ε represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region can be expressed by equation (3).

[FORMULA 3]

$$I_d = \frac{W \mu V_g V_d C_{ox}}{L} \exp\left(-\frac{E}{kT}\right) \quad (3)$$

Here, L represents the channel length and W represents the channel width, and L and W are each 10 μm in this case.

In addition, $V_d$ represents the drain voltage.

When dividing both sides of the equation (3) by $V_g$ and then taking logarithms of both sides, equation (4) can be obtained.

[FORMULA 4]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad (4)$$

The right side of the equation (4) is a function of $V_g$.

From the equation, it is found that the defect density N can be obtained from the slope of a line in which $\ln(I_d/V_g)$ is the ordinate and $1/V_g$ is the abscissa.

In other words, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm$^2$/Vs.

The measured mobility of an In—Sn—Zn oxide including a defect is approximately 35 cm$^2$/Vs.

However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by equation (5).

[FORMULA 5]

$$\frac{1}{\mu_1} = \frac{1}{\mu_0} + \frac{D}{B} \exp\left(-\frac{x}{G}\right) \quad (5)$$

In the equation (5), D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of the equation (5) is increased and accordingly the mobility $\mu_1$ is decreased.

Figure 13:
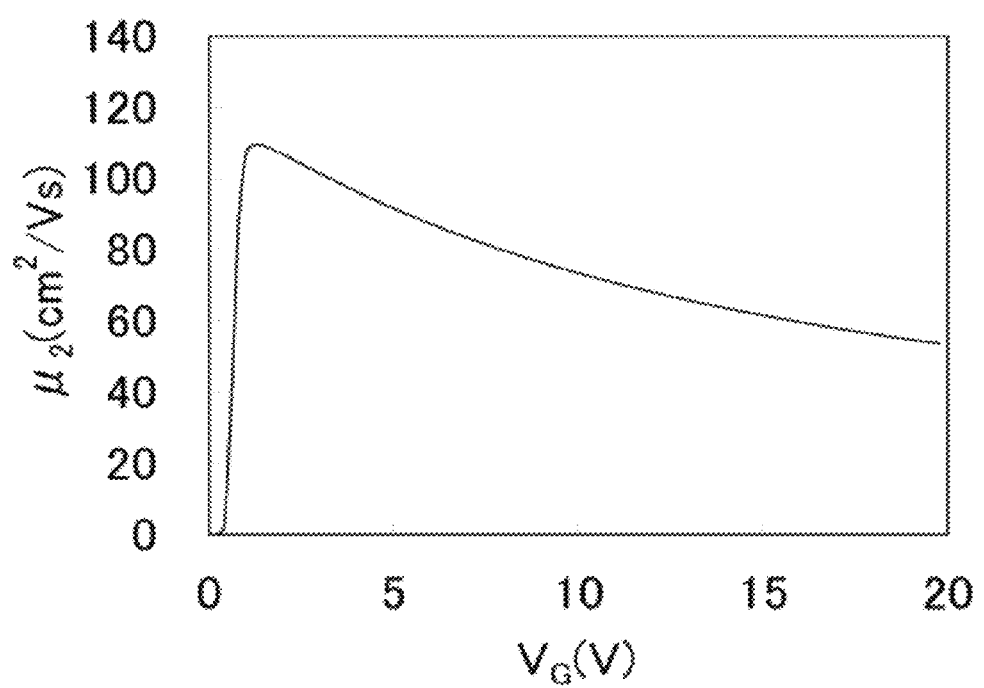
FIG. 13 illustrates a relation between gate voltage and field-effect mobility.

Calculation results F of the mobility $\mu_2$ of a transistor whose channel includes an ideal oxide semiconductor without a defect inside the semiconductor are illustrated in FIG. 13.

For the calculation, Sentaurus Device which is software manufactured by Synopsys, Inc. was used.

For the calculation, the band gap, the electron affinity, the relative permittivity, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown by the calculation results F, the mobility has a peak of more than 100 cm$^2$/Vs at a gate voltage that is a little over 1 V and is decreased as the gate voltage becomes higher because the influence of interface scattering is increased.

Note that in order to reduce interface scattering, it is desirable that a surface of the semiconductor layer be flat at the atomic level (atomic layer flatness).

Characteristics of minute transistors including an oxide semiconductor having such mobility were calculated.

The transistor used for calculation includes a channel formation region provided between a pair of n-type semiconductor regions in the oxide semiconductor layer.

The calculation was performed under the condition that the resistivity of the pair of n-type semiconductor regions is $2 \times 10^{-3}$ Ωcm.

The calculation was performed under the condition that a channel length was 33 nm and a channel width was 40 nm.

In addition, sidewall insulating regions are provided on the side walls of the gate electrodes.

The calculation was performed under the condition that the semiconductor regions which overlap with the sidewall insulating regions were off-set regions.

For the calculation, Sentaurus Device which is software manufactured by Synopsys, Inc. was used.

Figure 14A:
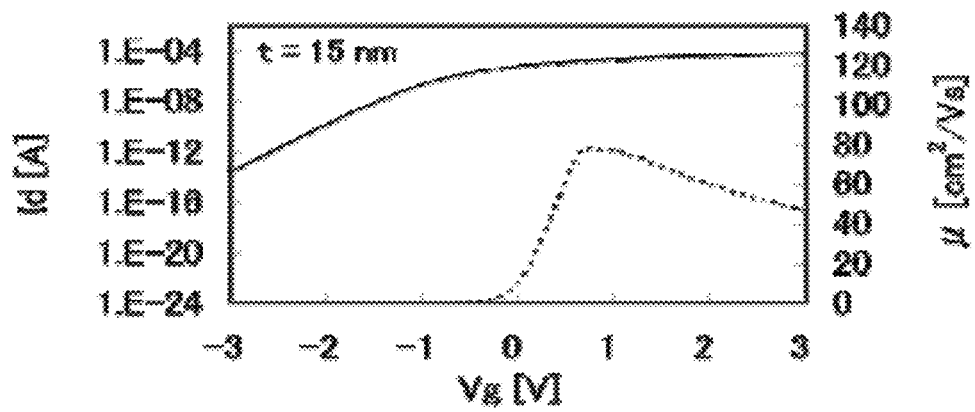
FIGS. 14A to 14C each illustrate a relation between gate voltage and drain current.
Figure 14B:
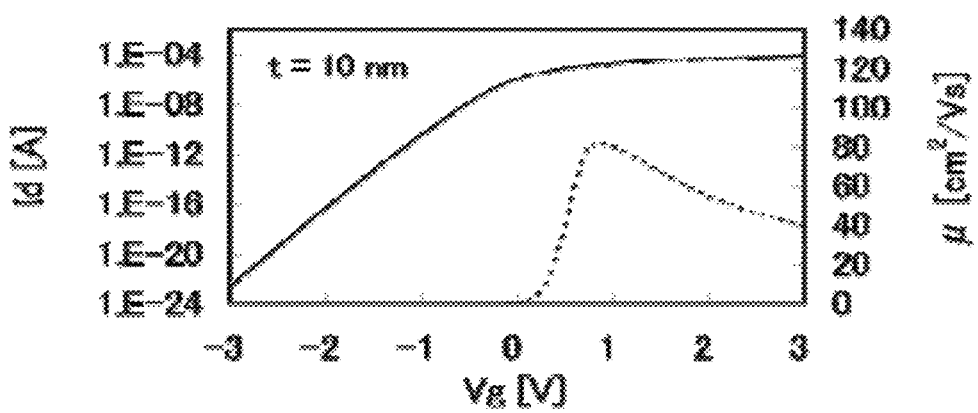
Figure 14C:
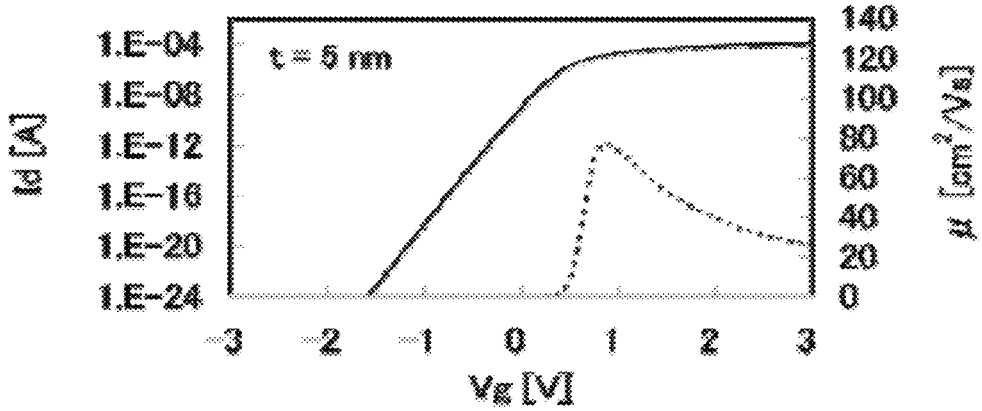

FIGS. 14A to 14C show the calculation results of the gate voltage ($V_g$: a potential difference between the gate and the source) dependence of the drain current ($I_d$, a solid line) and the mobility (μ, a dotted line) of the transistor.

The drain current $I_d$ is obtained by calculation under the condition that the drain voltage (a potential difference between the drain and the source) is +1 V and the mobility μ is obtained by calculation under the condition that the drain voltage is +0.1 V.

FIG. 14A shows the calculation result under the condition that the thickness of the gate insulating film is 15 nm.

FIG. 14B shows the calculation result under the condition that the thickness of the gate insulating film is 10 nm.

FIG. 14C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility μ and the drain current $I_d$ (on-state current) in an on state.

Figure 15A:
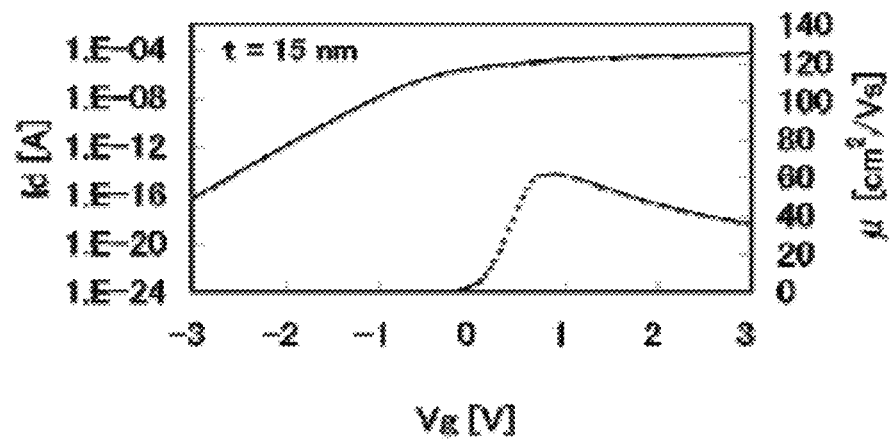
FIGS. 15A to 15C each illustrate a relation between gate voltage and drain current.
Figure 15B:
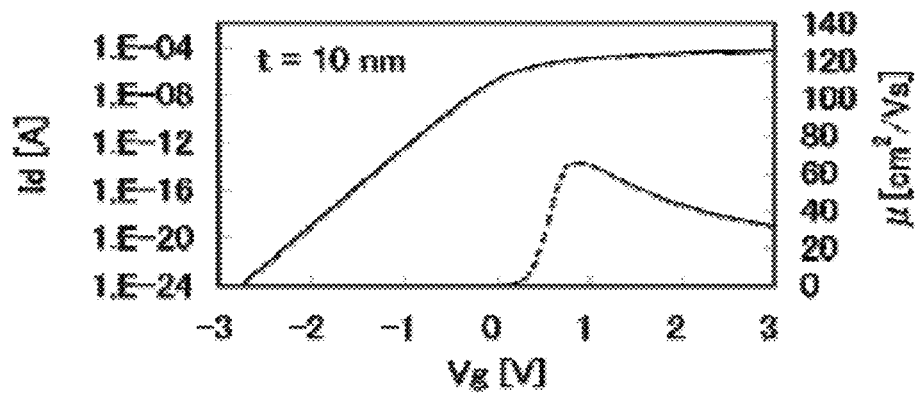
Figure 15C:
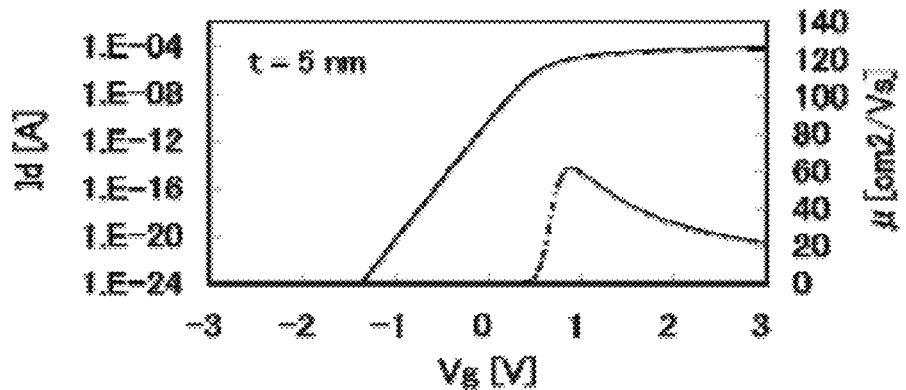

FIGS. 15A to 15C show the gate voltage ($V_g$) dependence of the drain current $I_d$ (a solid line) and the mobility μ (a dotted line) under the condition that the offset length $L_{off}$ (length of the sidewall insulating region) is 5 nm.

The drain current $I_d$ is obtained by calculation under the condition that the drain voltage is +1 V and the mobility μ is obtained by calculation under the condition that the drain voltage is +0.1 V.

FIG. 15A shows the calculation result under the condition that the thickness of the gate insulating film is 15 nm.

FIG. 15B shows the calculation result under the condition that the thickness of the gate insulating film is 10 nm.

FIG. 15C shows the calculation result under the condition that the thickness of the gate insulating film is 5 nm.

Figure 16A:
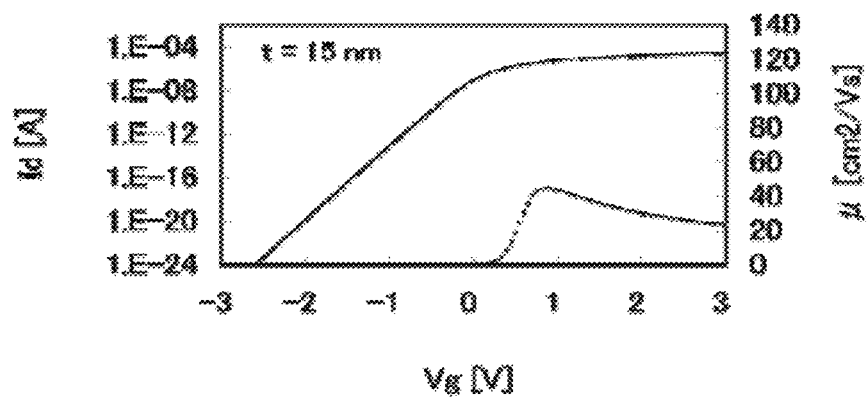
FIGS. 16A to 16C each illustrate a relation between gate voltage and drain current.
Figure 16B:
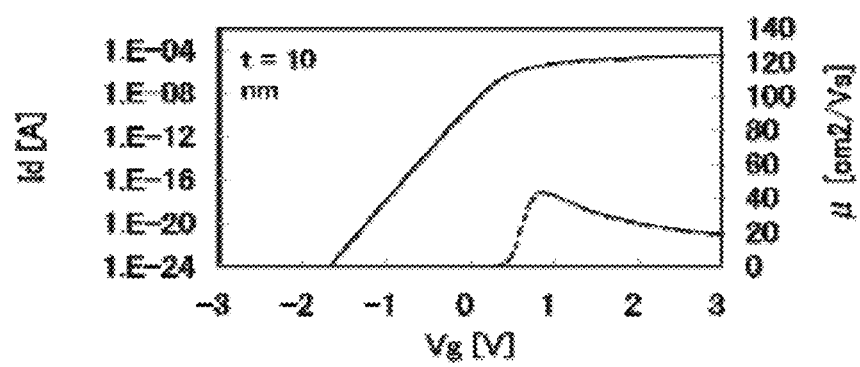
Figure 16C:
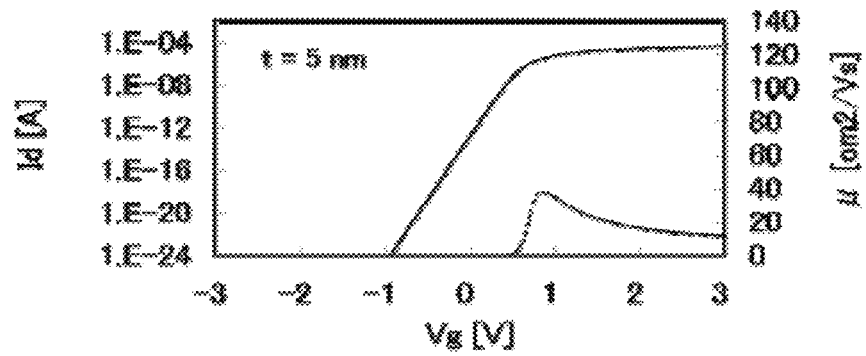

FIGS. 16A to 16C show the gate voltage ($V_g$) dependence of the drain current $I_d$ (a solid line) and the mobility μ (a dotted line) under the condition that the offset length $L_{off}$ (length of the sidewall insulating region) is 15 nm.

The drain current $I_d$ is obtained by calculation under the condition that the drain voltage is +1 V and the mobility μ is obtained by calculation under the condition that the drain voltage is +0.1 V.

FIG. 16A shows the calculation result under the condition that the thickness of the gate insulating film is 15 nm.

FIG. 16B shows the calculation result under the condition that the thickness of the gate insulating film is 10 nm.

FIG. 16C shows the calculation result under the condition that the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 $cm^2/Vs$ in FIGS. 14A to 14C, approximately 60 $cm^2/Vs$ in FIGS. 15A to 15C, and approximately 40 $cm^2/Vs$ in FIGS. 16A to 16C; thus, the peak of the mobility μ is decreased as the offset length $L_{off}$ is increased.

Further, the same applies to the off-state current.

The on-state current is also decreased as the offset length $L_{off}$ is increased; however, the decrease of the on-state current is much more gradual than the decrease of the off-state current.

Further, the graphs show that in either of the structures, the drain current exceeds 10 μA, which is required in a memory element and the like, at a gate voltage of around 1 V.

The contents of this embodiment or part thereof can be implemented in combination with any of the other embodiments and examples.

Example 1

In this example, calculation results of on-state current of the transistor 100 and the transistor 200 will be described. Note that in the calculation, the structures of the transistor 100 and the transistor 200 are simplified (see FIGS. 6A to 6C). Further, Sentaurus Device manufactured by Synopsys Inc. is used in the calculation.

Figure 6A:
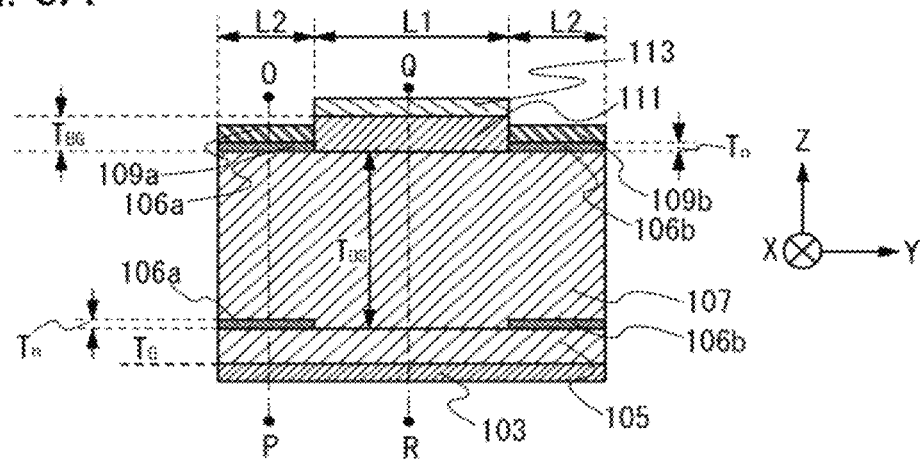
FIGS. 6A to 6C are cross-sectional views illustrating a structure of a transistor which is one embodiment of the present invention to be used for calculation.
Figure 6B:
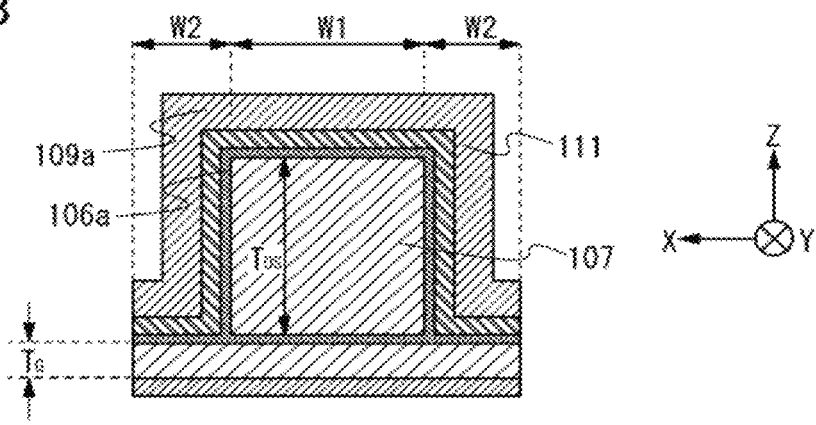
Figure 6C:
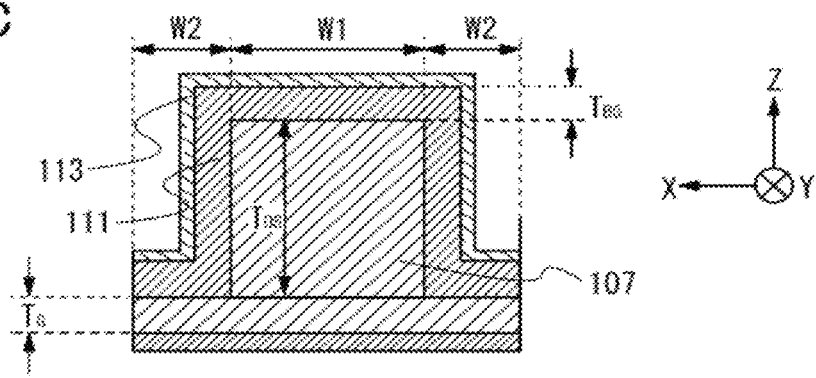

FIG. 6A is a simplified view of a cross-sectional structure along the channel length direction in the transistor 100 described in the embodiment (a cross-sectional structure taken along line A-B in FIG. 1A). FIG. 6B is a cross-sectional view in the X direction taken along line O-P in FIG. 6A. FIG. 6C is a cross-sectional view in the X direction taken along line Q-R in FIG. 6A. Note that components of FIGS. 6A to 6C corresponding to those of FIGS. 1A to 1C are denoted by the same numerals as those of FIGS. 1A to 1C. In the simplified cross-sectional view of the transistor 200, since the transistor 200 is a transistor in which the oxide semiconductor layer 107 of the transistor 100 is replaced with the crystalline oxide semiconductor layer 130, the transistor 200 is not illustrated in this example.

Parameters reflected on the calculation result of on-state current in the transistor 100 and the transistor 200 are as follows. Further, calculation parameters (band gap Eg, electron affinity χ, relative permittivity, and electron mobility) of the oxide semiconductor layer 107 are the same as those of the crystalline oxide semiconductor layer 130.

1. Channel length L1: 10 μm
2. Length L2 of the source electrode 109a and the drain electrode 109b: 5 μm
3. Thickness $T_{os}$ of the oxide semiconductor layer 107: 10 μm
4. Thickness $T_G$ of the insulating layer 111: 0.2 μm
5. Channel width W1: 100 μm
6. Width W2 of the source electrode 109a and the drain electrode 109b: 5 μm
7. Work function φM of tungsten used for the first gate electrode 103: 4.9 eV
8. Work function φM of titanium used for the source electrode 109a and the drain electrode 109b: 4.0 eV
9. Work function φM of molybdenum used for the second gate electrode 113: 4.8 eV
10. Band gap Eg, electron affinity χ, relative permittivity, and electron mobility of In—Ga—Zn-based metal oxide used for the oxide semiconductor layer 107: 3.15 eV, 4.3 eV, 15, and 10 $cm^2/Vs$
11. Relative permittivity of silicon oxynitride used for the gate insulating layer 105: 4.1

12. Relative permittivity of silicon oxide used for the insulating layer 111: 3.8

Note that the calculation is performed on the assumption that the first gate electrode 103, the source electrode 109a, the drain electrode 109b, and the second gate electrode 113 have the same potential regardless of their thicknesses, and thus, the on-state current does not reflect the thicknesses. In addition, because a voltage drop in the oxide semiconductor layers 106a and 106b having high carrier density is too small when the oxide semiconductor layers 106a and 106b have such thicknesses, the on-state current does not reflect the thickness of the oxide semiconductor layer 106a having high carrier density either.

Figure 7A:
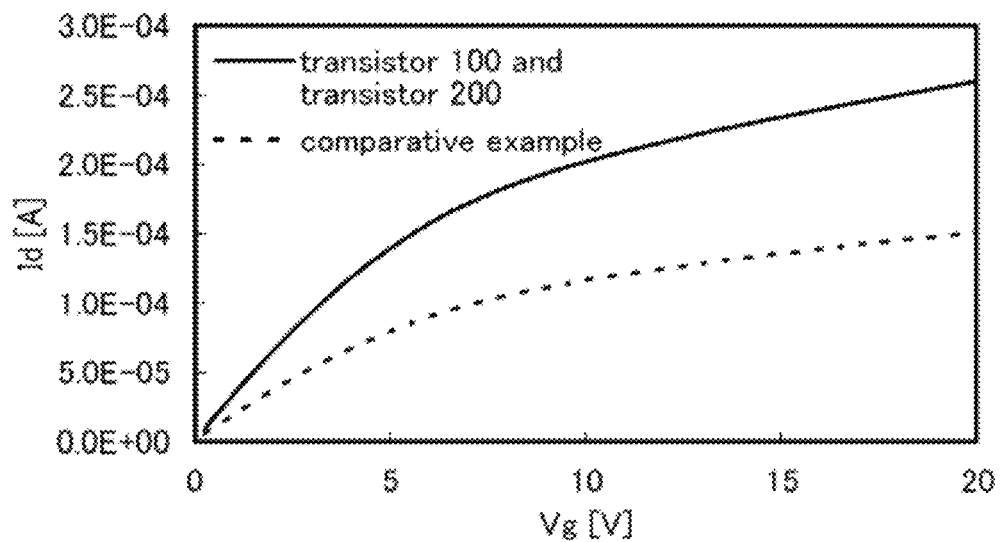
FIGS. 7A and 7B illustrate calculation results of drain current of a transistor which is one embodiment of the present invention.
Figure 8A:
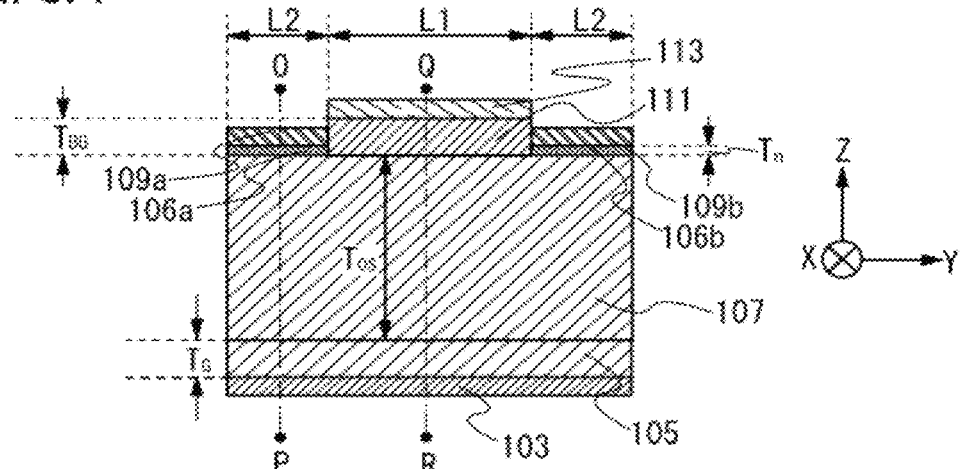
FIGS. 8A to 8C are cross-sectional views illustrating a structure of a transistor which is one embodiment of the present invention to be used for calculation.
Figure 8B:
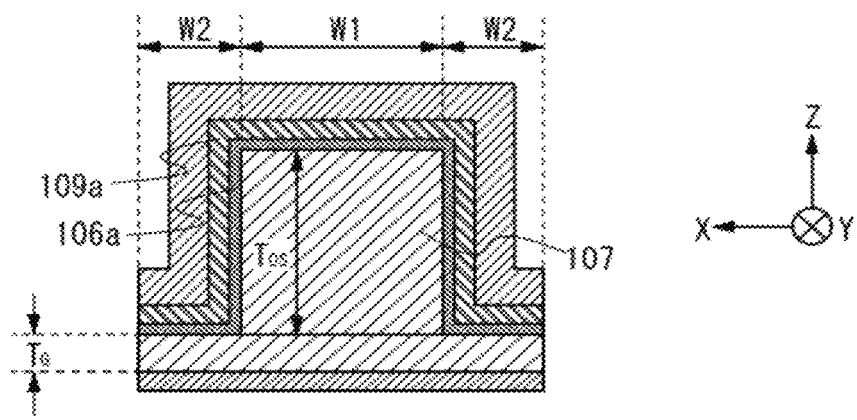
Figure 8C:
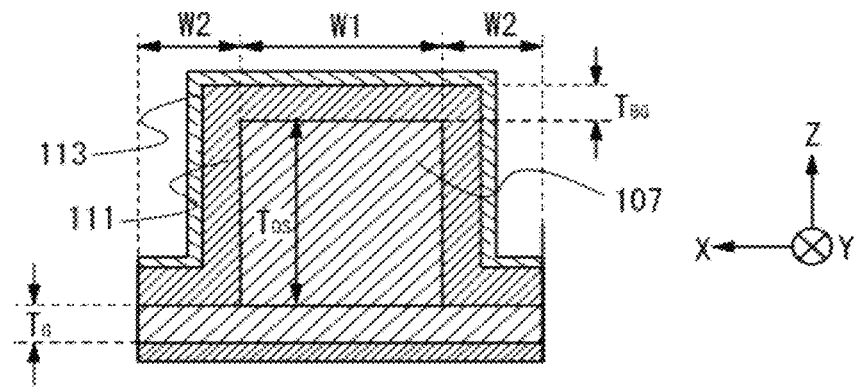

FIG. 7A shows calculation results of on-state current (drain current) of the transistor 100 and the transistor 200 when the thickness of the oxide semiconductor layer 107 was 10 μm and the gate voltage was 10 V and the drain voltage was changed from 0 V to 20 V. As a comparative example, the calculation which is performed in the similar manner on a transistor in which a portion in contact with the gate insulating layer 105 and the oxide semiconductor layer 107 of the oxide semiconductor layer 106a having high carrier density is removed, and the results thereof are shown in FIG. 7A. FIG. 8A corresponds to FIG. 6A and illustrates a simplified cross-sectional structure of the transistor of the comparative example. FIG. 8B corresponds to FIG. 6B and illustrates a cross-sectional view of FIG. 8A. FIG. 8C corresponds to FIG. 6C and illustrates a cross-sectional view of FIG. 8A.

In FIG. 7A, the horizontal axis represents the gate voltage ($V_g$), and the vertical axis represents the drain current ($V_d$). FIG. 7A shows that the on-state current (drain current) of each of the transistor 100 and the transistor 200 is higher than the on-state current (drain current) of the transistor of the comparative example.

Figure 7B:
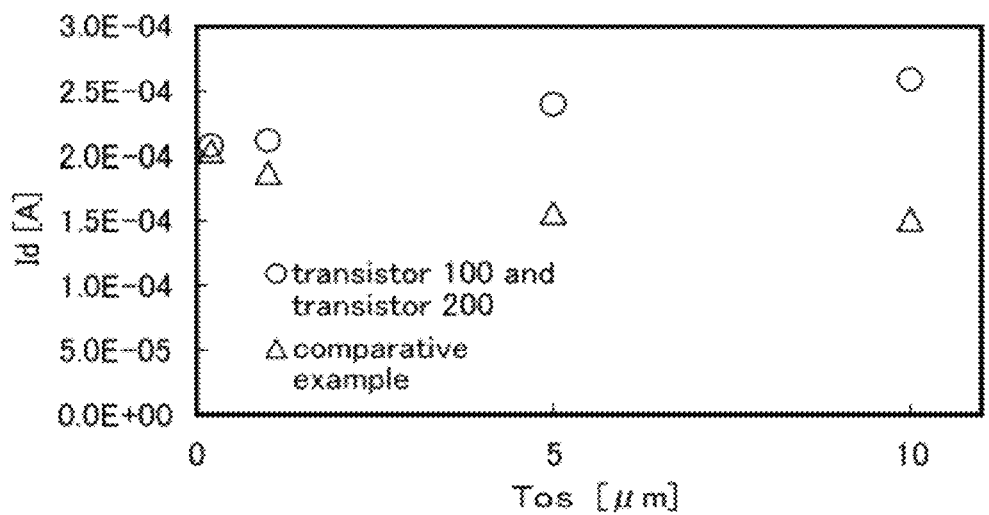

FIG. 7B shows calculation results of on-state current (drain current) of the transistor 100, the transistor 200, and the transistor of the comparative example when the thickness of the oxide semiconductor layer 107 was 0.2 μm, 1.0 μm, 5.0 μm, and 10 μm and the gate voltage was 10 V and the drain voltage was 20 V.

In FIG. 7B, the horizontal axis represents the thickness of the oxide semiconductor layer 107 ($T_{OS}$), and the vertical axis represents the drain current ($V_d$). FIG. 7B shows that, in the transistor of the comparative example, the on-state current (drain current) is decreased as the thickness of the oxide semiconductor layer 107 is increased. In particular, a decrease of the on-state current (drain current) is significant as the drain voltage is increased.

This results from the resistance in the thickness direction of the oxide semiconductor layer 107. In other words, in the case where the oxide semiconductor layer 107 was thin, an effect (voltage drop) by the resistance was small and was not involved in the decrease of the on-state current (drain current); however, as the thickness of the oxide semiconductor layer 107 was increased, an effect (voltage drop) by the resistance cannot be ignored; accordingly, it can be said that the on-state current (drain current) was decreased.

On the other hand, it is confirmed that, even in the case where the thickness of the oxide semiconductor layer 107 is increased in the transistor 100 and the transistor 200, the decrease of the on-state current (drain current) is suppressed and the on-state current (drain current) is improved.

This is because the oxide semiconductor layers 106a and 106b having high carrier density are formed so as to cover the end portions of the oxide semiconductor layer 107; therefore, an effect (voltage drop) of the resistance in the thickness direction of the oxide semiconductor layer 107 can be decreased even in the case where the oxide semiconductor layer 107 is thick.

As described above, in the transistor 100 and the transistor 200, the oxide semiconductor layers 106a and 106b having high carrier density face each other with the oxide semiconductor layer 107 interposed therebetween and each of the oxide semiconductor layers is in contact with part of each of the upper surface, the lower surface, and the side surface of one of the end portions of the oxide semiconductor layer 107 and part of an upper surface of the gate insulating layer 105; therefore, the decrease of the on-state current (drain current) can be suppressed and improvement in the on-state current can be realized.

Example 2

A transistor in which an oxide semiconductor containing In, Sn, and Zn (ITZO) is used can have favorable characteristics by depositing the oxide semiconductor while heating a substrate or by performing heat treatment after an oxide semiconductor film is formed.

Note that each of In, Sn, and Zn is preferably contained in a composition ratio at greater than or equal to 5 atomic %.

By intentionally heating the substrate after formation of the oxide semiconductor film containing In, Sn, and Zn, the field-effect mobility of the transistor can be improved.

The threshold voltage of an n-channel transistor can be positively shifted in the positive direction.

When the threshold voltage of the n-channel transistor is positively shifted, an absolute value of voltage used for holding an off state of the n-channel transistor can be decreased, and power consumption can be reduced.

Further, when the threshold voltage of the n-channel transistor is positively shifted, and the threshold voltage is greater than or equal to 0 V, a normally-off transistor can be formed.

Characteristics of a transistors including ITZO are described below.

(Common Condition of Samples A to C)

An oxide semiconductor layer was formed over a substrate so as to have a thickness of 15 nm, using a target having a composition ratio of In:Sn:Zn=1:1:1 under the condition that a gas flow rate was $Ar/O_2$=6/9 sccm, deposition pressure was 0.4 Pa, and deposition power was 100 W.

Next, the oxide semiconductor layer was etched to be an island-shaped oxide semiconductor layer.

Then, a tungsten layer was formed to have a thickness of 50 nm over the oxide semiconductor layer and processed by etching, so that a source electrode and a drain electrode were formed.

Next, a silicon oxynitride film (SiON) was formed so as to have a thickness of 100 nm, using silane gas ($SiH_4$) and dinitrogen monoxide ($N_2O$) by a plasma-enhanced CVD method, so that the silicon oxynitride film served as a gate insulating layer.

Next, a tantalum nitride film was formed so as to have a thickness of 15 nm and a tungsten film was formed so as to have a thickness of 135 nm; then, these films were processed by etching, thereby forming a gate electrode.

Further, a silicon oxynitride film (SiON) was formed so as to have a thickness of 300 nm by a plasma-enhanced CVD method, and then, a polyimide film was formed so as to have a thickness of 1.5 μm, thereby forming an interlayer insulating film.

Next, a contact hole was formed in the interlayer insulating film. A first titanium film was formed so as to have a thickness of 50 nm; an aluminum film was formed so as to have a thickness of 100 nm; a second titanium film was formed so as to have a thickness of 50 nm, and these films were processed by etching, thereby forming a measurement pad.

As described above, a semiconductor device having a transistor was formed.

(Sample A)

In Sample A, a substrate was not subjected to intentional heating during the formation of an oxide semiconductor layer.

Further, in Sample A, heat treatment was not performed after the formation of the oxide semiconductor layer and before processing of the oxide semiconductor layer by etching, (Sample B)

In Sample B, an oxide semiconductor layer was formed in a state that a substrate was heated to be at 200° C.

Further, in Sample B, heat treatment was not performed after the formation of the oxide semiconductor layer and before processing of the oxide semiconductor layer by etching.

The reason why the oxide semiconductor layer was formed in the state that the substrate was heated is because hydrogen that serves as a donor in the oxide semiconductor layer is removed.

(Sample C)

In Sample C, an oxide semiconductor layer was formed in a state that a substrate was heated to be at 200° C.

Further, in Sample C, heat treatment was performed at 650° C. under a nitrogen atmosphere for 1 hour after the formation of the oxide semiconductor layer and before processing of the oxide semiconductor layer by etching; then, heat treatment was performed at 650° C. under an oxygen atmosphere for 1 hour.

The reason why the heat treatment was performed at 650° C. under a nitrogen atmosphere for 1 hour is because hydrogen that serves as a donor in the oxide semiconductor layer is removed.

Here, oxygen is also removed by the heat treatment used for removing hydrogen that serves as a donor in the oxide semiconductor layer, and oxygen deficiency which serves as a carrier in the oxide semiconductor layer occurs.

Thus, an effect of reducing oxygen deficiencies was tried to be obtained by performing heat treatment at 650° C. under an oxygen atmosphere for 1 hour.

(Characteristics of Transistors of Samples A to C)

Figure 17A:
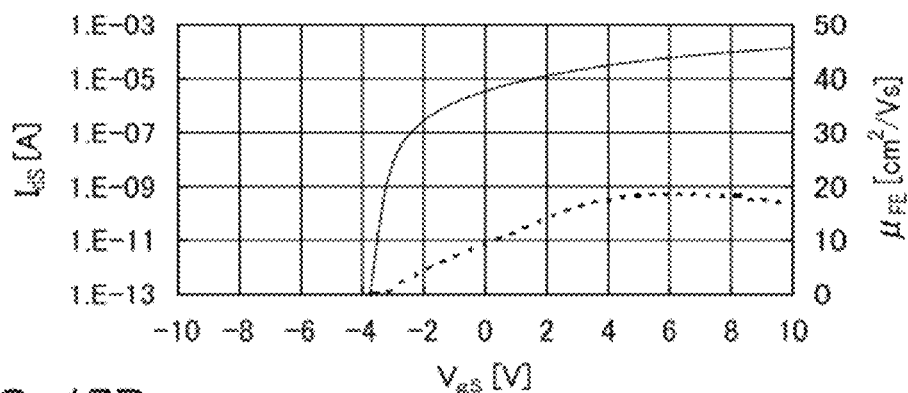
FIGS. 17A to 17C illustrate characteristics of transistors.

Initial characteristics of the transistor of Sample A are shown in FIG. 17A. Note that in FIG. 17A, a solid line represents drain current ($I_{ds}$), and a dashed line represents field-effect mobility.

Figure 17B:
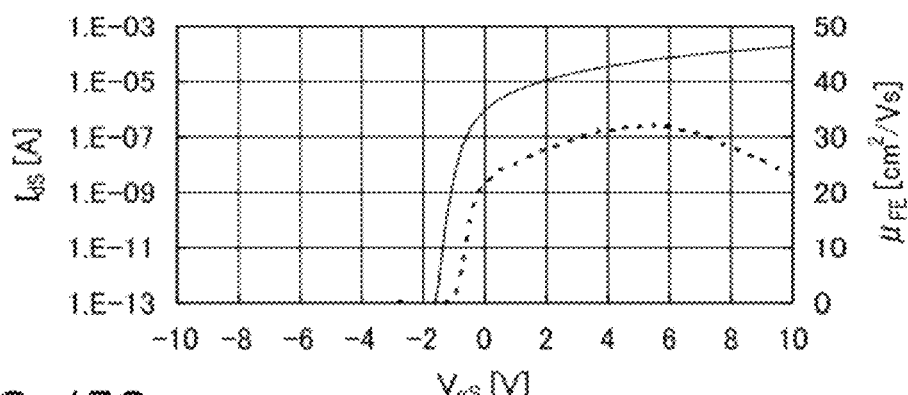

Initial characteristics of the transistor of Sample B are shown in FIG. 17B. Note that in FIG. 17B, a solid line represents drain current ($I_{ds}$), and a dashed line represents field-effect mobility.

Figure 17C:
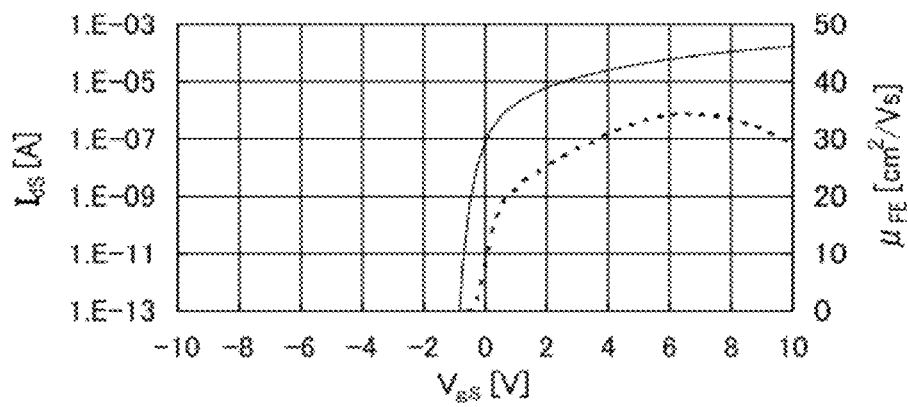

Initial characteristics of the transistor of Sample C are shown in FIG. 17C. Note that in FIG. 17C, a solid line represents drain current ($I_{ds}$), and a dashed line represents field-effect mobility.

The field-effect mobility of the transistor of Sample A was 18.8 cm$^2$/Vsec.

The field-effect mobility of the transistor of Sample B was 32.2 cm$^2$/Vsec.

The field-effect mobility of the transistor of Sample C was 34.5 cm$^2$/Vsec.

Here, crystallinity was observed in a sample formed by a formation method which was similar to those of Sample B and Sample C in each of which heating was performed on the substrate at the time of formation of the oxide semiconductor layer when a cross-section of an oxide semiconductor layer formed by the formation method which was similar to those of Samples A to C was observed with a transmission electron microscope (TEM).

Surprisingly, the sample in which heating was performed on the substrate at the time of formation of the oxide semiconductor layer has a crystalline portion and a non-crystalline portion, and the crystalline portion has c-axis alignment.

The sample in which heating was performed on the substrate at the time of formation of the oxide semiconductor layer has a new crystal structure that has not existed conventionally because crystals in a crystalline portion of normal polycrystal are oriented not in the same direction but differently.

It can be understood that, from the comparison of the results shown in FIGS. 17A to 17C, the hydrogen element which serves as a donor can be removed by heat treatment performed on the substrate at the time of film formation or heat treatment after film formation; therefore, the threshold voltage of the n-channel transistor can be positively shifted.

In other words, the threshold voltage of Sample B in which heating was performed on the substrate at the time of formation of the oxide semiconductor layer is more positively shifted than the threshold voltage of Sample A in which heating was not performed on the substrate at the time of formation of the oxide semiconductor layer.

It is found that, when Sample B and Sample C in each of which heating was performed on the substrate at the time of formation of the oxide semiconductor layer are compared, Sample C in which heat treatment was performed after the formation of the oxide semiconductor layer is more positively shifted than Sample B in which heat treatment is not performed after the formation of the oxide semiconductor layer.

As the temperature of heat treatment is higher, a light element such as hydrogen is easily removed; therefore, as the temperature of heat treatment is higher, hydrogen is easily removed.

Accordingly, it is considered that a more positive shift can be obtained as the temperature of heat treatment at the time of formation of the oxide semiconductor layer or after the formation of the oxide semiconductor layer is further increased.

(Results of Gate BT Stress Test of Sample B and Sample C)

Gate BT stress tests were performed on Sample B (no heat treatment after the formation of the oxide semiconductor layer) and Sample C (heat treatment after the formation of the oxide semiconductor layer).

First, $V_{gs}$–$I_{ds}$ characteristics of transistors were measured at a substrate temperature of 25° C. and $V_{ds}$ of 10 V, and the characteristics of the transistor before heating and application of high voltage with positive polarity were measured.

Then, the substrate temperature was set to 150° C. and $V_{ds}$ was set to 0.1 V.

After that, $V_{gs}$ of 20 V was applied to the gate electrode, so that $V_{gs}$ of 20 V was applied to the gate insulating film 608, and the condition was kept for 1 hour.

Next, $V_{gs}$ was set to 0 V.

Then, $V_{gs}$–$I_{ds}$ characteristics of the transistors were measured at a substrate temperature of 25° C. and $V_{ds}$ of 10 V, and the characteristics of the transistor after heating and application of high voltage with positive polarity were measured.

As described above, to compare the characteristics of the transistors before and after heating and application of high voltage with positive polarity is referred to as a positive BT test.

On the other hand, first, $V_{gs}$–$I_{ds}$ characteristics of the transistors were measured at a substrate temperature of 25° C. and $V_{ds}$ of 10 V, and the characteristics of the transistor before heating and application of high voltage with negative polarity were measured.

Then, the substrate temperature was set to 150° C. and $V_{ds}$ was set to 0.1 V.

After that, $V_{gs}$ of −20 V was applied to the gate insulating film 608, and the condition was kept for 1 hour.

Next, $V_{gs}$ was set to 0 V.

Then, $V_{gs}$-$I_{ds}$ characteristics of the transistors were measured at a substrate temperature of 25° C. and $V_{ds}$ of 10 V, and the characteristics of the transistor after heating and application of high voltage with negative polarity were measured.

As described above, to compare the characteristics of the transistors before and after heating and application of high voltage with negative polarity is referred to as a negative BT test.

Figure 18A:
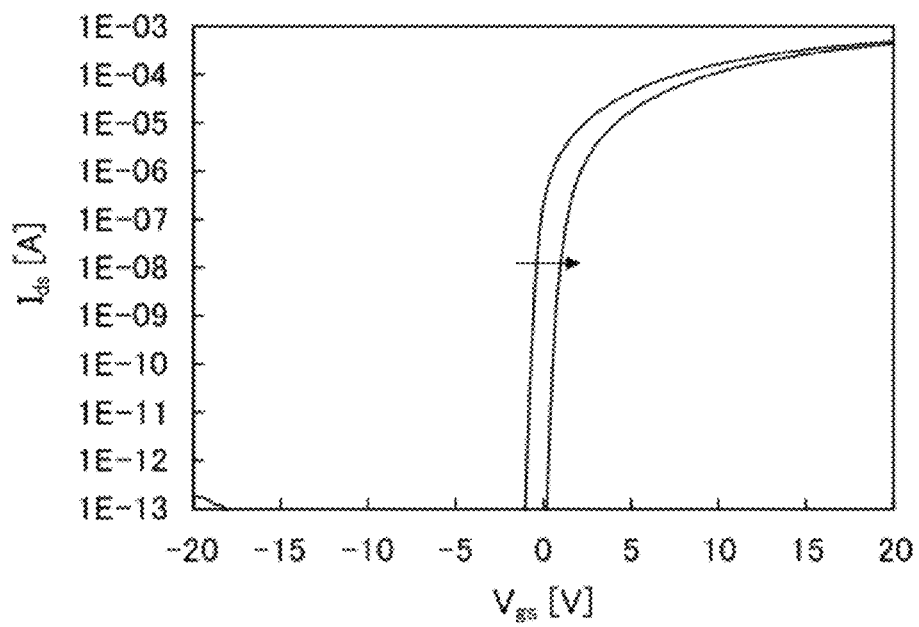
FIGS. 18A and 18B illustrate characteristics of transistors.
Figure 18B:
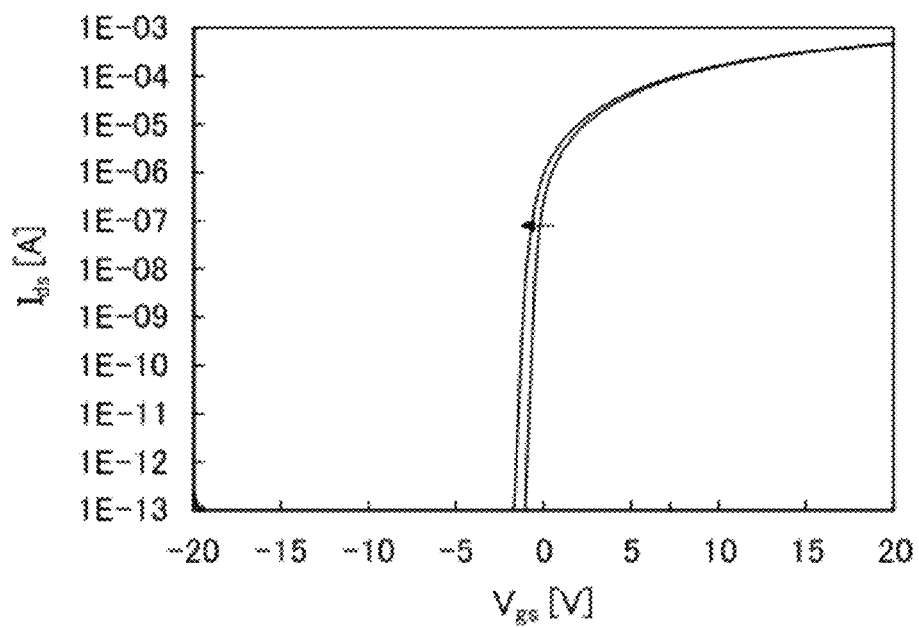

FIG. 18A shows results of the positive BT test of Sample B, and FIG. 18B shows results of the negative BT test of Sample B.

Figure 19A:
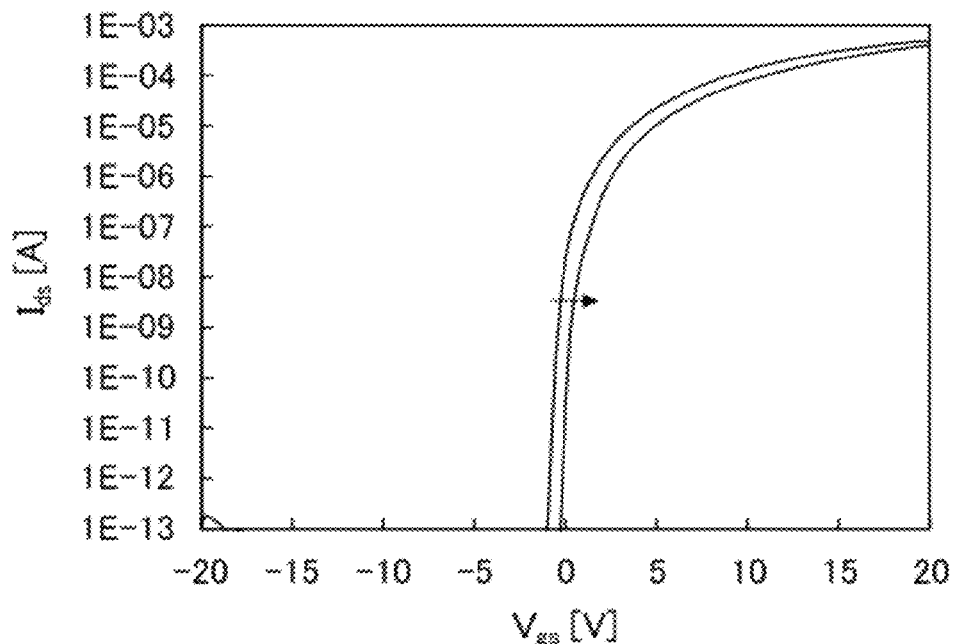
FIGS. 19A and 19B illustrate characteristics of transistors.
Figure 19B:
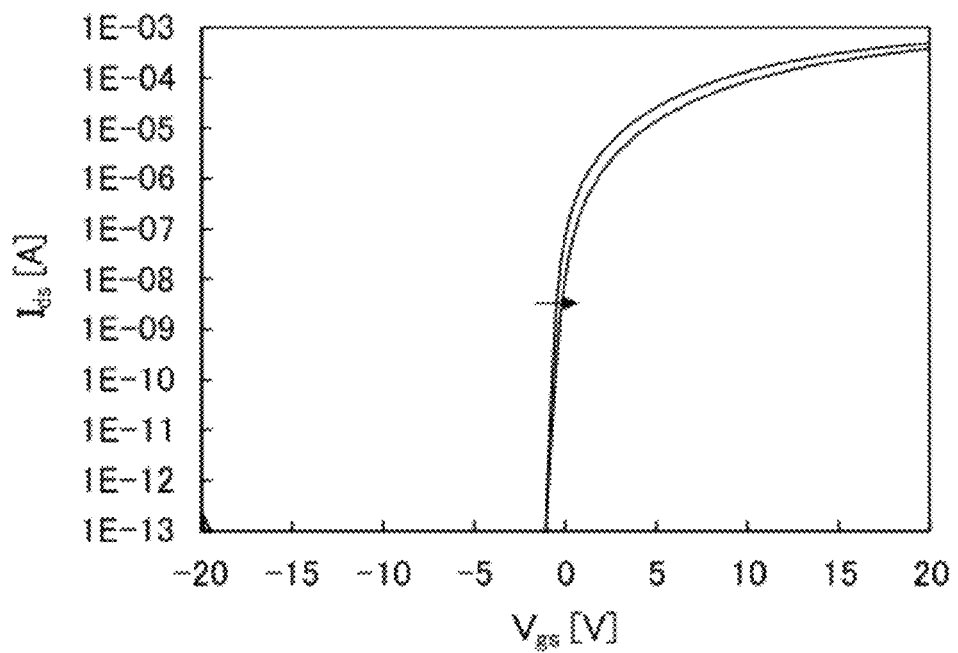

FIG. 19A shows results of the positive BT test of Sample C, and FIG. 19B shows results of the negative BT test of Sample C.

The positive BT test and the negative BT test are tests used to determine deterioration of the transistors; it is found that the threshold voltage can be positively shifted by at least the positive BT tests with reference to FIG. 18A and FIG. 19A.

In particular, it is found that the transistor became normally-off when the positive BT test was performed in FIG. 18A.

Accordingly, it is found that, when the positive BT test as well as the heat treatment at the time of manufacture of the transistors was performed, a positive shift of the threshold voltage can be promoted and a normally-off transistor can be formed.

FIG. 20 shows a relation between the off-state current of the transistor of Sample A and the inverse of substrate temperature (absolute temperature) at measurement.

Here, the horizontal axis represents a value (1000/T) obtained by multiplying an inverse of substrate temperature at measurement by 1000.

Note that the amount of current in the case where the channel width is 1 μm is illustrated in FIG. 20.

The off-state current was less than or equal to $1 \times 10^{-19}$ A/μm when the substrate temperature was 125° C. (1000/T was approximately 2.51).

The off-state current was less than or equal to $1 \times 10^{-20}$ A/μm when the substrate temperature was 85° C. (1000/T was approximately 2.79).

In other words, it is found that extremely low off-state current was obtained as compared to a transistor including a silicon semiconductor.

The off-state current is decreased as the temperature is lower; therefore, it is clear that lower off-state current is obtained at room temperature.

This application is based on Japanese Patent Application serial No. 2010-246951 filed with Japan Patent Office on Nov. 3, 2010 and Japanese Patent Application serial No. 2011-108892 filed with Japan Patent Office on May 14, 2011, the entire contents of which are hereby incorporated by reference.

What is claimed is:

1. A semiconductor device comprising:
a first gate electrode;
a first insulating layer covering the first gate electrode;
a first oxide semiconductor layer that overlaps with the first gate electrode and is in contact with the first insulating layer;
a second oxide semiconductor layer and a third oxide semiconductor layer that are in contact with the first insulating layer;
a source electrode on and in contact with the second oxide semiconductor layer;
a drain electrode on and in contact with the third oxide semiconductor layer;
a second insulating layer covering the source electrode, the drain electrode, and the first oxide semiconductor layer; and
a second gate electrode that is on and in contact with the second insulating layer,
wherein each of the second oxide semiconductor layer and the third oxide semiconductor layer has higher carrier density than the first oxide semiconductor layer, and
wherein the second oxide semiconductor layer and the third oxide semiconductor layer face each other with the first oxide semiconductor layer interposed therebetween, and each of the second oxide semiconductor layer and the third oxide semiconductor layer is partly in contact with each of an upper surface, a lower surface, and a side surface of one of end portions of the first oxide semiconductor layer.

2. The semiconductor device according to claim 1, wherein a thickness of the first oxide semiconductor layer is greater than or equal to 0.2 μm and less than or equal to 10 μm.

3. The semiconductor device according to claim 1, wherein the first oxide semiconductor layer is a crystalline oxide semiconductor layer, and the crystalline oxide semiconductor layer has an a-b plane parallel to a surface and has c-axis aligned in a direction perpendicular to the surface.

4. The semiconductor device according to claim 3, wherein the crystalline oxide semiconductor layer includes zinc.

5. The semiconductor device according to claim 3, wherein the crystalline oxide semiconductor layer includes zinc and indium.

6. The semiconductor device according to claim 1, wherein the first insulating layer contains a larger amount of oxygen than stoichiometry.

7. A semiconductor device comprising:
a first gate electrode;
a first insulating layer over the first gate electrode;
a first oxide semiconductor layer over and partly in contact with the first insulating layer;
a second oxide semiconductor layer and a third oxide semiconductor layer that are in contact with the first insulating layer and a lower surface of the first oxide semiconductor layer;
a source electrode and a drain electrode that are over and electrically connected to the first oxide semiconductor layer; and
a second insulating layer covering the first oxide semiconductor layer, the source electrode and the drain electrode,
wherein each of the second oxide semiconductor layer and the third oxide semiconductor layer has higher carrier density than the first oxide semiconductor layer.

8. The semiconductor device according to claim 7, further comprising a second gate electrode over the second insulating layer.

9. The semiconductor device according to claim 7,
wherein the second oxide semiconductor layer is located between the first oxide semiconductor layer and the source electrode; and
wherein the third oxide semiconductor layer is located between the first oxide semiconductor layer and the drain electrode.

10. The semiconductor device according to claim 7, wherein a thickness of the first oxide semiconductor layer is greater than or equal to 0.2 μm and less than or equal to 10 μm.

11. The semiconductor device according to claim 7, wherein the first oxide semiconductor layer is a crystalline oxide semiconductor layer, and the crystalline oxide semiconductor layer has an a-b plane parallel to a surface and has c-axis aligned in a direction perpendicular to the surface.

12. The semiconductor device according to claim 11, wherein the crystalline oxide semiconductor layer includes at least one of indium, gallium and zinc.

13. The semiconductor device according to claim 7, wherein the first insulating layer contains a larger amount of oxygen than stoichiometry.

14. A semiconductor device comprising:
a first insulating layer;
a first oxide semiconductor layer over and partly in contact with the first insulating layer;
a second oxide semiconductor layer and a third oxide semiconductor layer that are in contact with the first insulating layer and a lower surface of the first oxide semiconductor layer;
a source electrode and a drain electrode that are over and electrically connected to the first oxide semiconductor layer;
a second insulating layer covering the first oxide semiconductor layer, the source electrode and the drain electrode; and
a first gate electrode over the second insulating layer,
wherein each of the second oxide semiconductor layer and the third oxide semiconductor layer has higher carrier density than the first oxide semiconductor layer.

15. The semiconductor device according to claim 14, further comprising a second gate electrode below the first insulating layer.

16. The semiconductor device according to claim 14,
wherein the second oxide semiconductor layer is located between the first oxide semiconductor layer and the source electrode; and
wherein the third oxide semiconductor layer is located between the first oxide semiconductor layer and the drain electrode.

17. The semiconductor device according to claim 14, wherein a thickness of the first oxide semiconductor layer is greater than or equal to 0.2 μm and less than or equal to 10 μm.

18. The semiconductor device according to claim 14, wherein the first oxide semiconductor layer is a crystalline oxide semiconductor layer, and the crystalline oxide semiconductor layer has an a-b plane parallel to a surface and has c-axis aligned in a direction perpendicular to the surface.

19. The semiconductor device according to claim 18, wherein the crystalline oxide semiconductor layer includes at least one of indium, gallium and zinc.

20. The semiconductor device according to claim 14, wherein the first insulating layer contains a larger amount of oxygen than stoichiometry.

* * * * *